United States Patent
Takimoto

(10) Patent No.: US 8,043,436 B2
(45) Date of Patent: Oct. 25, 2011

(54) SUBSTRATE CLEANING SYSTEM, SUBSTRATE CLEANING METHOD, SUBTRATE CLEANING PROGRAM, AND PROGRAM RECORDING MEDIUM

(75) Inventor: Yuji Takimoto, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 542 days.

(21) Appl. No.: 11/992,164

(22) PCT Filed: Sep. 20, 2006

(86) PCT No.: PCT/JP2006/318621
§ 371 (c)(1), (2), (4) Date: Mar. 18, 2008

(87) PCT Pub. No.: WO2007/040049
PCT Pub. Date: Apr. 12, 2007

(65) Prior Publication Data
US 2009/0260655 A1    Oct. 22, 2009

(30) Foreign Application Priority Data
Oct. 5, 2005 (JP) .................. 2005-292991

(51) Int. Cl.
*B08B 7/04* (2006.01)
(52) U.S. Cl. ............................ 134/18; 134/26
(58) Field of Classification Search ............ 134/18, 134/26
See application file for complete search history.

(56) References Cited

U.S. PATENT DOCUMENTS

2002/0035762 A1* 3/2002 Okuda et al. ............... 15/77
2002/0059686 A1* 5/2002 Uemukai et al. ............ 15/77
2003/0138551 A1 7/2003 Miyata
2005/0022325 A1 2/2005 Uemukai et al.
(Continued)

FOREIGN PATENT DOCUMENTS

JP        8-8324        1/1996
(Continued)

OTHER PUBLICATIONS

PCT Notification of Transmittal of Translation of the International Preliminary Examination Report (Form PCT/IB/338) dated Jan. 2004.

(Continued)

*Primary Examiner* — Michael Kornakov
*Assistant Examiner* — Nicole Blan
(74) *Attorney, Agent, or Firm* — Smith, Gambrell & Russell, LLP

(57) ABSTRACT

A substrate cleaning system according to the present invention comprises cleaning devices, and a controller for controlling the driving of the cleaning devices in accordance with driving recipes predetermined. The controller prioritizes the cleaning devices, calculates, on the basis of a driving recipe for a cleaning device having a higher priority and a driving recipe for a cleaning device having a lower priority, a time in which the two cleaning devices can interfere with each other, and sets the calculated time as a waiting time. The cleaning device having the higher priority is made to start cleaning a substrate from a predetermined cleaning-starting position, while the cleaning device having the lower priority is kept waiting in a predetermined waiting position. When or after the waiting time has elapsed since the cleaning device having the higher priority started cleaning, the cleaning device having the lower priority is made to move from the waiting position and start cleaning the substrate.

26 Claims, 16 Drawing Sheets

U.S. PATENT DOCUMENTS

2007/0072092 A1* 3/2007 Shimoaoki et al. ............... 430/5

FOREIGN PATENT DOCUMENTS

| JP | 8-263114 | 10/1996 |
| JP | 2002-134460 | 5/2002 |
| JP | 2005-228961 | 8/2005 |

OTHER PUBLICATIONS

PCT International Preliminary Report on Patentability (Form PCT/IB/373) dated Jan. 2004.

PCT Written Opinion of the International Searching Authority (Form/ISA/237) dated Apr. 2005.

Japanese Office Action issued on Sep. 15, 2009 for Japanese Application No. 2005-292991 w/ English translation.

Supplementary European Search Report issued on Dec. 3, 2010 for Application No. 06 81 0317.

Japanese Preliminary Report issued on Jun. 23, 2010 for Application No. 2005-292991 w/ English language translation.

Japanese Office Action issued on Jun. 28, 2011 for Application No. 2005-292991 w/ English language translation.

* cited by examiner

DRIVING RECIPE 55 FOR THE FIRST CLEANING DEVICE 20

| STEP | HORIZONTAL POSITION | VERTICAL POSITION |
|---|---|---|
| 1 | RETREAT POSITION (P1) | DOWN ↓ UP |
| 2 | RETREAT POSITION (P1) ↓ 150mm/s CLEANING-STARTING POSITION (P2) | UP |
| 3 | CLEANING-STARTING POSITION (P2) | UP ↓ DOWN |
| 4 | CLEANING-STARTING POSITION (P2) ↓ 15mm/s SPEED-CHANGE POSITION (P3) | DOWN |
| 5 | SPEED-CHANGE POSITION (P3) ↓ 10mm/s CLEANING END POSITION (P4) | DOWN |
| 6 | CLEANING END POSITION (P4) | DOWN ↓ UP |
| 7 | CLEANING END POSITION (P4) ↓ 150mm/s RETREAT POSITION (P1) | UP |
| 8 | RETREAT POSITION (P1) | UP ↓ DOWN |

FIG. 8A

DRIVING RECIPE 56 FOR THE SECOND CLEANING DEVICE 21

| STEP | HORIZONTAL POSITION | VERTICAL POSITION |
|---|---|---|
| 1 | RETREAT POSITION (P5) | DOWN |

FIG. 8B

DRIVING RECIPE 57 FOR THE THIRD CLEANING DEVICE 22

| STEP | HORIZONTAL POSITION | VERTICAL POSITION |
|---|---|---|
| 1 | RETREAT POSITION (P6) | DOWN ↓ UP |
| 2 | RETREAT POSITION (P6) ↓ 150mm/s CLEANING-STARTING POSITION (P7) | UP |
| 3 | CLEANING-STARTING POSITION (P7) | UP ↓ DOWN |
| 4 | CLEANING-STARTING POSITION (P7) ↓ 15mm/s SPEED-CHANGE POSITION (P8) | DOWN |
| 5 | SPEED-CHANGE POSITION (P8) ↓ 10mm/s CLEANING END POSITION (P9) | DOWN |
| 6 | CLEANING END POSITION (P9) | DOWN ↓ UP |
| 7 | CLEANING END POSITION (P9) ↓ 150mm/s RETREAT POSITION (P6) | UP |
| 8 | RETREAT POSITION (P6) | UP ↓ DOWN |

FIG. 8C

DRIVING RECIPE 62

| STEP | HORIZONTAL POSITION | VERTICAL POSITION |
|---|---|---|
| 1 | RETREAT POSITION (P6) | DOWN ↓ UP |
| 2 | RETREAT POSITION (P6) ↓ 150mm/s WAITING POSITION (P10) | UP |
| 3 | WAITING POSITION (P10) | UP ↓ MIDDLE |
| 4 | WAITING POSITION (P10) | MIDDLE |
| 5 | WAITING POSITION (P10) ↓ 30mm/s CLEANING-STARTING POSITION (P7) | MIDDLE |
| 6 | CLEANING-STARTING POSITION (P7) | MIDDLE ↓ DOWN |
| 7 | CLEANING-STARTING POSITION (P7) ↓ 15mm/s SPEED-CHANGE POSITION (P8) | DOWN |
| 8 | SPEED-CHANGE POSITION (P8) ↓ 10mm/s CLEANING END POSITION (P9) | DOWN |
| 9 | CLEANING END POSITION (P9) | DOWN ↓ UP |
| 10 | CLEANING END POSITION (P9) 150mm/s RETREAT POSITION (P6) | UP |
| 11 | RETREAT POSITION (P6) | UP ↓ DOWN |

FIG. 12

DRIVING RECIPE 64 FOR THE FIRST CLEANING DEVICE 20

| STEP | HORIZONTAL POSITION | VERTICAL POSITION |
|---|---|---|
| 1 | RETREAT POSITION (P1) | DOWN<br>↓<br>UP |
| 2 | RETREAT POSITION (P1)<br>↓ 150mm/s<br>CLEANING-STARTING POSITION (P2) | UP |
| 3 | CLEANING-STARTING POSITION (P2) | UP<br>↓<br>DOWN |
| 4 | CLEANING-STARTING POSITION (P2)<br>↓ 15mm/s<br>SPEED-CHANGE POSITION (P3) | DOWN |
| 5 | SPEED-CHANGE POSITION (P3)<br>↓ 10mm/s<br>CLEANING END POSITION (P4) | DOWN |
| 6 | CLEANING END POSITION (P4) | DOWN<br>↓<br>UP |
| 7 | CLEANING END POSITION (P4)<br>↓ 150mm/s<br>RETREAT POSITION (P1) | UP |
| 8 | RETREAT POSITION (P1) | UP<br>↓<br>DOWN |

FIG. 14A

DRIVING RECIPE 65 FOR THE SECOND CLEANING DEVICE 21

| STEP | HORIZONTAL POSITION | VERTICAL POSITION |
|---|---|---|
| 1 | RETREAT POSITION (P5) | DOWN ↓ UP |
| 2 | RETREAT POSITION (P5) ↓ 150mm/s CLEANING-STARTING POSITION (P2) | UP |
| 3 | CLEANING-STARTING POSITION (P2) | UP ↓ DOWN |
| 4 | CLEANING-STARTING POSITION (P2) ↓ 15mm/s SPEED-CHANGE POSITION (P3) | DOWN |
| 5 | SPEED-CHANGE POSITION (P3) ↓ 10mm/s CLEANING END POSITION (P4) | DOWN |
| 6 | CLEANING END POSITION (P4) | DOWN ↓ UP |
| 7 | CLEANING END POSITION (P4) ↓ 150mm/s RETREAT POSITION (P5) | UP |
| 8 | RETREAT POSITION (P5) | UP ↓ DOWN |

FIG. 14B

DRIVING RECIPE 66 FOR THE THIRD CLEANING DEVICE 22

| STEP | HORIZONTAL POSITION | VERTICAL POSITION |
|---|---|---|
| 1 | RETREAT POSITION (P6) | DOWN |

FIG. 14C

DRIVING RECIPE 67

| STEP | HORIZONTAL POSITION | VERTICAL POSITION |
|---|---|---|
| 1 | RETREAT POSITION (P1) | DOWN ↓ UP |
| 2 | RETREAT POSITION (P1) ↓ 150mm/s WAITING POSITION (P12) | UP |
| 3 | WAITING POSITION (P12) | UP ↓ MIDDLE |
| 4 | WAITING POSITION (P12) | MIDDLE |
| 5 | WAITING POSITION (P12) ↓ 150mm/s CLEANING-STARTING POSITION (P2) | MIDDLE |
| 6 | CLEANING-STARTING POSITION (P2) | MIDDLE ↓ DOWN |
| 7 | CLEANING-STARTING POSITION (P2) ↓ 15mm/s SPEED-CHANGE POSITION (P3) | DOWN |
| 8 | SPEED-CHANGE POSITION (P3) ↓ 10mm/s CLEANING END POSITION (P4) | DOWN |
| 9 | CLEANING END POSITION (P4) | DOWN ↓ UP |
| 10 | CLEANING END POSITION (P4) 150mm/s RETREAT POSITION (P1) | UP |
| 11 | RETREAT POSITION (P1) | UP ↓ DOWN |

FIG. 15

SUBSTRATE CLEANING SYSTEM, SUBSTRATE CLEANING METHOD, SUBTRATE CLEANING PROGRAM, AND PROGRAM RECORDING MEDIUM

BACKGROUND OF THE INVENTION

1. Field of the Invention

The present invention relates to a substrate cleaning system for cleaning a substrate such as a semiconductor wafer or a liquid crystalline substrate, to a method of cleaning such a substrate, to a substrate cleaning program, and to a program recording medium.

2. Background Art

Conventionally, the processes of manufacturing semiconductor parts, flat displays, or the like include the process of suitably cleaning both sides of semiconductor wafers or liquid crystalline substrates. Particularly, recent smaller-sized, higher-density patterns have generated demand for a complicated substrate-cleaning process using a plurality of cleaning devices in combination. Further, mass-production of semiconductor parts or the like requires that the complicated substrate-cleaning process be performed efficiently in a short time.

Therefore, a substrate cleaning system comprising a plurality of cleaning devices for cleaning substrates, in which the driving of the cleaning devices is controlled by a controller in accordance with driving recipes made beforehand has conventionally been used to clean substrates (see Japanese Laid-Open Patent Publication No. 2002-134460, for example).

In the case where this conventional substrate cleaning system is used to clean substrates, an operator first makes driving recipes that prescribe the operation of the cleaning devices in the order of time. These driving recipes are then read in the substrate cleaning system by means of an input means in the system. Thereafter, faithfully following the respective driving recipes, the controller makes the cleaning devices perform cleaning operation.

There is, however, a possibility that when the controller drives the cleaning devices faithfully following the driving recipes made by the operator, the cleaning devices might collide to interfere with each other. For this reason, in the conventional substrate cleaning system, the cleaning devices are separately operated one by one, or if it is known from the driving recipes that the cleaning devices will interfere with each other, the input means refuses to input the driving recipes. Consequently, when the cleaning devices are operated one by one, a longer time is needed to clean a substrate, which can reduce the throughput of the substrate-cleaning process.

On the other hand, when the input means has refused to input the driving recipes that cause interference between the driving devices, it has so far been necessary for the operator to make again driving recipes that cause no interfere between the cleaning devices. A long time and much labor are therefore sometimes required to make driving recipes.

SUMMARY OF THE INVENTION

In view of the aforementioned background, the present invention was achieved. An object of the present invention is, by overcoming the shortcomings in the prior art, to provide a substrate cleaning system, method, and program that make it possible to clean substrates with high efficiency.

A first substrate cleaning system according to the present invention comprises cleaning devices for cleaning a substrate, and a controller for controlling the driving of the cleaning devices in accordance with driving recipes predetermined, wherein the controller prioritizes the cleaning devices; calculates, on the basis of a driving recipe for a cleaning device having a higher priority and a driving recipe for a cleaning device having a lower priority, a time in which the cleaning device having the higher priority and the cleaning device having the lower priority can interfere with each other and sets the calculated time as a waiting time; makes the cleaning device having the higher priority start cleaning the substrate from a predetermined cleaning-starting position towards periphery of the substrate; keeps the cleaning device having the lower priority waiting in a predetermined waiting position; and moves the cleaning device having the lower priority from the waiting position when or after the waiting time has elapsed since the cleaning device having the higher priority started cleaning, and makes the cleaning device having the lower priority start cleaning the substrate from a predetermined cleaning-starting position towards periphery of the substrate.

According to the first substrate cleaning system of the present invention, if the cleaning devices interfere with each other when driven in accordance with the driving recipes made beforehand, one of the cleaning devices is kept waiting in the predetermined waiting position. Namely, cleaning operation using a plurality of the cleaning devices can be carried out while automatically avoiding interference between the cleaning devices. Therefore, the time needed for cleaning a substrate can be decreased, and the throughput of the substrate-cleaning process can thus be improved. Moreover, since the operator need not make driving recipes again, the time and labor required to make driving recipes can be reduced.

In the first substrate cleaning system according to the present invention, the controller may set travel coordinate axes, each of which is characteristic of a cleaning device; may unify the travel coordinate axes into a unified travel coordinate axis; and may set the waiting time by using the unified travel coordinate axis. According to such a substrate cleaning system, whether a plurality of the cleaning devices will interfere with each other can be judged accurately, and the time and region in which the cleaning devices can interfere with each other can be known precisely.

Further, in the first substrate cleaning system according to the present invention, the controller may judge, on the basis of the driving recipe for the cleaning device having the higher priority and the driving recipe for the cleaning device having the lower priority, whether the cleaning device having the higher priority and the cleaning device having the lower priority can interfere with each other, and may set the waiting time when it is judged that the interference can occur. According to such a substrate cleaning system, it is judged, on the basis of the driving recipe for the cleaning device having the higher priority and the driving recipe for the cleaning device having the lower priority, whether interference can occur between the cleaning device having the higher priority and the cleaning device having the lower priority. And only when it is judged that the interference can occur, the cleaning device having the lower priority is kept waiting. Therefore, even if the interference can occur, it can be avoided, and if the interference does not occur, cleaning operation can be carried out smoothly without keeping the cleaning device having the lower priority waiting meaninglessly. Furthermore, if the controller has judged, on the basis of the driving recipe for the cleaning device having the higher priority and the driving recipe for the cleaning device having the lower priority, that the cleaning device having the higher priority and the cleaning device having the lower priority can interfere with each other two or more times, the controller may calculate the time in which the two cleaning devices can interfere with each other in each time and may set longest time among the calculated times as the waiting time. According to such a substrate cleaning system, even if the cleaning device having the higher priority and the cleaning device having the lower priority can interfere with each other two or more times, the interference is avoidable. Furthermore, in the case where the direction in which the cleaning device having the higher priority performs cleaning is the same as the direction in which the cleaning device having the lower priority performs cleaning, the controller may calculate a time in which one of the cleaning devices, sitting in the cleaning-starting position, can interfere with the other, and a time in which one of the cleaning devices, sitting in a cleaning end position, can interfere with the other, and may set longer time among the calculated times as the waiting time.

Furthermore, in the first substrate cleaning system according to the present invention, the waiting position of the cleaning device having the lower priority may be positioned between a retreat position, set outside the substrate, in which the cleaning device having the lower priority is held when the cleaning device having the lower priority is not cleaning the substrate, and the cleaning-starting position of the cleaning device having the lower priority, and the three positions may be on a horizontal line. According to such a substrate cleaning system, the waiting position can be set in the route of the cleaning device having the lower priority traveling, to its cleaning-starting position, from the retreat position, set outside the substrate, in which the cleaning device having the lower priority is held when the cleaning device having the lower priority is not cleaning the substrate, i.e., before the cleaning device having the lower priority starts substrate-cleaning operation. Namely, it is possible to keep the cleaning device having the lower priority waiting in such a position that the distance between this position and the cleaning-starting position is shorter than the distance between the retreat position and the cleaning-starting position. Therefore, the time needed for the cleaning device having the lower priority to move, after waiting, from the waiting position to the cleaning-starting position can be decreased. Thus, the time needed for cleaning a substrate can further be decreased.

Furthermore, in the first substrate cleaning system according to the present invention, the waiting position of the cleaning device having the lower priority may be at a position horizontally apart from the cleaning device having the higher priority, sitting in the cleaning-starting position, by a minimum accessible distance that is the distance of the cleaning device having the lower priority from the cleaning device having the higher priority when the cleaning device having the lower priority gets closest to the cleaning device having the higher priority without coming into contact with the cleaning device having the higher priority. According to such a substrate cleaning system, the time needed for the cleaning device having the lower priority to reach the cleaning-starting position after leaving the waiting position is further decreased. It is thus possible to decrease further the time needed to clean a substrate.

Furthermore, in the first substrate cleaning system according to the present invention, the cleaning device having the lower priority may have a cleaning member that will face the substrate, the cleaning member may move in such a fashion that, after vertically come away from the substrate, the cleaning member vertically re-approaches the substrate as the cleaning device having the lower priority moves, to the cleaning-starting position, from a retreat position, set outside the substrate, in which the cleaning device having the lower priority is held when the cleaning device having the lower priority is not cleaning the substrate, and the waiting position of the cleaning device having the lower priority may be in the route of the cleaning member vertically re-approaching the substrate. According to such a substrate cleaning system, the time needed for the cleaning device having the lower priority to move vertically to the cleaning-starting position on the substrate can be eliminated or decreased. Thus, the time needed to clean a substrate can further be shortened.

Furthermore, in the first substrate cleaning system according to the present invention, a region in which the cleaning device having the higher priority and the cleaning device having the lower priority can interfere with each other may be set as an interference region, and the time in which the interference can occur may be obtained by calculating the difference between the time needed for the cleaning device having the higher priority to come out of the interference region after leaving the cleaning-starting position, and the time needed for the cleaning device having the lower priority to reach a position in the interference region, closest to the cleaning device having the higher priority, after leaving the waiting position.

A second substrate cleaning system according to the present invention comprises cleaning devices for cleaning a substrate and a controller for controlling the driving of the cleaning devices in accordance with driving recipes predetermined, wherein the controller prioritizes the cleaning devices; sets, on the basis of a driving recipe for a cleaning device having a higher priority and a driving recipe for a cleaning device having a lower priority, an interference region in which the cleaning device having the higher priority and the cleaning device having the lower priority can interfere with each other; makes the cleaning device having the higher priority start cleaning the substrate from a predetermined cleaning-starting position towards periphery of the substrate; keeps the cleaning device having the lower priority waiting in a predetermined waiting position; and moves the cleaning device having the lower priority from the waiting position when or after the cleaning device having the higher priority has come out of the interference region, and makes the cleaning device having the lower priority start cleaning the substrate from a predetermined cleaning-starting position towards periphery of the substrate.

According to the second substrate cleaning system of the present invention, if a plurality of the cleaning devices interfere with each other when driven in accordance with the driving recipes made beforehand, one of the cleaning devices is kept waiting in the predetermined waiting position. Namely, cleaning operation using a plurality of cleaning devices can be carried out while automatically avoiding interference between the cleaning devices. Therefore, the time needed to clean a substrate can be decreased, and the throughput of the substrate-cleaning process can thus be improved. Moreover, since the operator need not make driving recipes again, the time and labor required to make driving recipes can be reduced.

In the second substrate cleaning system according to the present invention, the interference region may range between the position of the end, nearest to the cleaning device having the lower priority, of the cleaning device having the higher priority, sitting in the cleaning-starting position, and the position of the end, nearest to the cleaning device having the higher priority, of the cleaning device having the lower priority, sitting in the cleaning-starting position.

A first substrate cleaning method according to the present invention is a substrate cleaning method of cleaning substrates by controlling the driving of cleaning devices in accordance with driving recipes predetermined, comprising the steps of: prioritizing the cleaning devices; calculating, on the basis of a driving recipe for a cleaning device having a higher priority and a driving recipe for a cleaning device having a lower priority, a time in which the cleaning device having the higher priority and the cleaning device having the lower priority can interfere with each other, and setting the calculated time as a waiting time; making the cleaning device having the higher priority start cleaning a substrate from a predetermined cleaning-starting position towards periphery of the substrate; keeping the cleaning device having the lower priority waiting in a predetermined waiting position; and moving the cleaning device having the lower priority from the waiting position when or after the waiting time has elapsed since the cleaning device having the higher priority started cleaning, and making the cleaning device having the lower priority start cleaning the substrate from a predetermined cleaning-starting position towards periphery of the substrate.

According to the first substrate cleaning method of the present invention, if a plurality of the cleaning devices interfere with each other when driven in accordance with the driving recipes made beforehand, one of the cleaning devices is kept waiting in the predetermined waiting position. Namely, cleaning operation using a plurality of the cleaning devices can be carried out while automatically avoiding interference between the cleaning devices. Therefore, the time needed to clean a substrate can be decreased, and the throughput of the substrate-cleaning process can thus be improved. Moreover, since the operator need not make driving recipes again, the time and labor required to make driving recipes can be reduced.

In the first substrate cleaning method according to the present invention, travel coordinate axes, each of which is characteristic of a cleaning device, may be set; the travel coordinate axes may be unified into a unified travel coordinate axis; and the waiting time may be set by using the unified travel coordinate axis. According to such a substrate cleaning method, whether the cleaning devices will interfere with each other can be judged accurately, and the time and region in which the cleaning devices interfere with each other can be known precisely.

Further, in the first substrate cleaning method according to the present invention, it may be judged, on the basis of the driving recipe for the cleaning device having the higher priority and the driving recipe for the cleaning device having the lower priority, whether the cleaning device having the higher priority and the cleaning device having the lower priority can interfere with each other, and the waiting time may be set if it is judged that the interference can occur. According to such a substrate cleaning method, whether the cleaning device having the higher priority and the cleaning device having the lower priority can interfere with each other is judged from the driving recipe for the cleaning device having the higher priority and that for the cleaning device having the lower priority. And only when it is judged that the interference can occur, the cleaning device having the lower priority is kept waiting. Therefore, even if the interference can occur, it can be avoided, and if the interference does not occur, cleaning operation can be carried out smoothly without keeping the cleaning device having the lower priority waiting meaninglessly. Furthermore, if it is judged, on the basis of the driving recipe for the cleaning device having the higher priority and the driving recipe for the cleaning device having the lower priority, that the cleaning device having the higher priority and the cleaning device having the lower priority can interfere with each other two or more times, the time in which the two cleaning devices can interfere with each other in each time may be calculated, and longest time among the calculated times my be set as the waiting time. According to such a substrate cleaning method, even if the cleaning device having the higher priority and the cleaning device having the lower priority can interfere with each other two or more times, the interference is avoidable.

Furthermore, in the first substrate cleaning method according to the present invention, the waiting position of the cleaning device having the lower priority may be positioned between a retreat position, set outside the substrate, in which the cleaning device having the lower priority is held when the cleaning device having the lower priority is not cleaning the substrate, and the cleaning-starting position of the cleaning device having the lower priority, and the three positions may be on a horizontal line. According to such a substrate cleaning method, the waiting position can be set in the route of the cleaning device having the lower priority moving, to its cleaning-starting position, from the retreat position, set outside the substrate, in which the cleaning device having the lower priority is held when the cleaning device having the lower priority is not cleaning the substrate, i.e., before the cleaning device having the lower priority carries out substrate-cleaning operation. Namely, the cleaning device having the lower priority can be kept waiting in such a position that the distance between this position and the cleaning-starting position is shorter than that between the retreat position and the cleaning-starting position. Therefore, the time needed for the cleaning device to move, after waiting, from the waiting position to the cleaning-starting position can be decreased. Thus, the time needed to clean a substrate can further be decreased.

Furthermore, in the first substrate cleaning method according to the present invention, the waiting position of the cleaning device having the lower priority may be at a position horizontally apart from the cleaning device having the higher priority, sitting in the cleaning-starting position, by a minimum accessible distance that is the distance of the cleaning device having the lower priority from the cleaning device having the higher priority when the cleaning device having the lower priority gets closest to the cleaning device having the higher priority without coming into contact with the cleaning device having the higher priority. According to such a substrate cleaning method, the time needed for the cleaning device having the lower priority to move from the waiting position to the cleaning-starting position is further decreased. Thus, the time needed to clean a substrate can further be shortened.

Furthermore, in the first substrate cleaning method according to the present invention, the cleaning device having the lower priority may have a cleaning member that will face the substrate, the cleaning member may move in such a fashion that, after vertically come away from the substrate, the cleaning member vertically re-approaches the substrate as the cleaning device having the lower priority moves, to the cleaning-starting position, from a retreat position, set outside the substrate, in which the cleaning device having the lower priority is held when the cleaning device having the lower priority is not cleaning the substrate, and the waiting position of the cleaning device having the lower priority may be in the route of the cleaning member vertically re-approaching the substrate. According to such a substrate cleaning method, the time needed for the cleaning device having the lower priority to move vertically towards the cleaning-starting position on the substrate can be eliminated or decreased. Thus, the time needed to clean a substrate can further be shortened.

Furthermore, in the first substrate cleaning method according to the present invention, a region in which the cleaning device having the higher priority and the cleaning device having the lower priority can interfere with each other may be set as an interference region, and the time in which the interference can occur may be obtained by calculating the difference between the time needed for the cleaning device having the higher priority to come out of the interference region after leaving the cleaning-starting position, and the time needed for the cleaning device having the lower priority to reach a position in the interference region, closest to the cleaning device having the higher priority, after leaving the waiting position.

A second substrate cleaning method according to the present invention is a substrate cleaning method of cleaning substrates by controlling the driving of cleaning devices in accordance with driving recipes predetermined, comprising the steps of: prioritizing the cleaning devices; setting, on the basis of a driving recipe for a cleaning device having a higher priority and a driving recipe for a cleaning device having a lower priority, an interference region in which the cleaning device having the higher priority and the cleaning device having the lower priority can interfere with each other; making the cleaning device having the higher priority start cleaning a substrate from a predetermined cleaning-starting position towards periphery of the substrate; keeping the cleaning device having the lower priority waiting in a waiting position outside the interference region; and moving the cleaning device having the lower priority from the waiting position when or after the cleaning device having the higher priority has come out of the interference region, and making the cleaning device having the lower priority start cleaning the substrate from a predetermined cleaning-starting position towards periphery of the substrate. According to the second substrate cleaning method of the present invention, if a plurality of the cleaning devices interfere with each other when driven in accordance with the driving recipes made beforehand, one of the cleaning devices is kept waiting in the predetermined waiting position. Namely, cleaning operation using a plurality of the cleaning devices can be carried out while automatically avoiding interference between them. Therefore, the time needed to clean a substrate can be decreased, and the throughput of the substrate-cleaning process can thus be improved. Moreover, since the operator need not make driving recipes again, the time and labor required to make driving recipes can be reduced.

A first substrate cleaning program according to the present invention is a substrate cleaning program with which a substrate cleaning system comprising cleaning devices for cleaning a substrate, in which the driving of the cleaning devices is controlled in accordance with driving recipes predetermined, carries out cleaning operation, the substrate cleaning program comprising: prioritizing step of prioritizing the cleaning devices; setting waiting time step of calculating, on the basis of a driving recipe for a cleaning device having a higher priority and a driving recipe for a cleaning device having a lower priority, the a time in which the cleaning device having the higher priority and the cleaning device having the lower priority can interfere with each other, and setting the calculated time as a waiting time; starting higher priority cleaning device step of making the cleaning device having the higher priority start cleaning a substrate from a predetermined cleaning-starting position towards periphery of the substrate; keeping lower priority cleaning device waiting step of keeping the cleaning device having the lower priority waiting in a predetermined waiting position; and starting lower priority cleaning device step of moving the cleaning device having the lower priority from the waiting position when or after the waiting time has elapsed since the cleaning device having the higher priority started cleaning, and making the cleaning device having the lower priority start cleaning the substrate from a predetermined cleaning-starting position towards periphery of the substrate.

In the first substrate cleaning program according to the present invention, travel coordinate axes, each of which is characteristic of each cleaning device, may be set; the travel coordinate axes are unified into a unified travel coordinate axis; and the waiting time may be set in the setting waiting time step by using the unified travel coordinate axis.

Further, in the first substrate cleaning program according to the present invention, if it is judged, on the basis of the driving recipe for the cleaning device having the higher priority and the driving recipe for the cleaning device having the lower priority, that the cleaning device having the higher priority and the cleaning device having the lower priority can interfere with each other two or more times, the time in which the two cleaning devices can interfere with each other in each time may be calculated, and longest time among the calculated times may be set as the waiting time. According to such a substrate cleaning program, even if the cleaning device having the higher priority and the cleaning device having the lower priority can interfere with each other two or more times, the interference is avoidable.

A second substrate cleaning program according to the present invention is a substrate cleaning program with which a substrate cleaning system comprising cleaning devices for cleaning a substrate, in which the driving of the cleaning devices is controlled in accordance with driving recipes predetermined, carries out cleaning operation, the substrate cleaning program comprising: prioritizing step of prioritizing the cleaning devices; setting interference region step of setting, on the basis of a driving recipe for a cleaning device having a higher priority and a driving recipe for a cleaning device having a lower priority, an interference region in which the cleaning device having the higher priority and the cleaning device having the lower priority can interfere with each other; starting higher priority cleaning device step of making the cleaning device having the higher priority start cleaning the substrate from a predetermined cleaning-starting position towards periphery of the substrate; keeping lower priority cleaning device waiting step of keeping the cleaning device having the lower priority waiting in a waiting position outside the interference region; and starting lower priority cleaning device step of moving the cleaning device having the lower priority from the waiting position when or after the cleaning device having the higher priority has come out of the interference region and making the cleaning device having the lower priority start cleaning the substrate from a predetermined cleaning-starting position towards periphery of the substrate.

A first program recording medium according to the present invention is a program recording medium in which a substrate cleaning program with which a substrate cleaning system comprising cleaning devices for cleaning a substrate, in which the driving of the cleaning devices is controlled in accordance with driving recipes predetermined, carries out cleaning operation is recorded, the substrate cleaning program comprising: prioritizing step of prioritizing the cleaning devices; setting waiting time step of calculating, on the basis of a driving recipe for a cleaning device having a higher priority and a driving recipe for a cleaning device having a lower priority, a time in which the cleaning device having the higher priority and the cleaning device having the lower priority can interfere with each other, and setting the calculated time as a waiting time; starting higher priority cleaning device step of making the cleaning device having the higher priority start cleaning a substrate from a predetermined cleaning-starting position towards periphery of the substrate; keeping lower priority cleaning device waiting step of keeping the cleaning device having the lower priority waiting in a predetermined waiting position; and starting lower priority cleaning device step of moving the cleaning device having the lower priority from the waiting position when or after the waiting time has elapsed since the cleaning device having the higher priority started cleaning, and making the cleaning device having the lower priority start cleaning the substrate from a predetermined cleaning-starting position towards periphery of the substrate.

A second program recording medium according to the present invention is a program recording medium in which a substrate cleaning program with which a substrate cleaning system comprising cleaning devices for cleaning a substrate, in which the driving of the cleaning devices is controlled in accordance with driving recipes predetermined, carries out cleaning operation is recorded, the substrate cleaning program comprising: prioritizing step of prioritizing the cleaning devices; setting interference region step of setting, on the basis of a driving recipe for a cleaning device having a higher priority and a driving recipe for a cleaning device having a lower priority, an interference region in which the cleaning device having the higher priority and the cleaning device having the lower priority can interfere with each other; starting higher priority cleaning device step of making the cleaning device having the higher priority start cleaning the substrate from a predetermined cleaning-starting position towards periphery of the substrate; keeping lower priority cleaning device waiting step of keeping the cleaning device having the lower priority waiting in a waiting position outside the interference region; and starting lower priority cleaning device step of moving the cleaning device having the lower priority from the waiting position when or after the cleaning device having the higher priority has come out of the interference region and making the cleaning device having the lower priority start cleaning the substrate from a predetermined cleaning-starting position towards periphery of the substrate.

BRIEF DESCRIPTION OF THE DRAWINGS

FIG. 8A is a chart for explaining a driving recipe input by an operator.

FIG. 8B is a chart for explaining a driving recipe input by an operator.

FIG. 8C is a chart for explaining a driving recipe input by an operator.

FIG. 12 is a chart for explaining a driving recipe that prescribes the operation of the third cleaning device.

FIG. 14A is a chart for explaining a driving recipe input by an operator.

FIG. 14B is a chart for explaining a driving recipe input by an operator.

FIG. 14C is a chart for explaining a driving recipe input by an operator.

FIG. 15 is a chart for explaining a driving recipe that prescribes the operation of the first cleaning device.

EMBODIMENTS FOR CARRYING OUT THE INVENTION

An embodiment of a substrate cleaning system according to the present invention, an embodiment of a substrate cleaning method to be used in the substrate cleaning system, and an embodiment of a substrate cleaning program with which the substrate cleaning system carries out cleaning operation will be described hereinafter with reference to the accompanying drawings.

Figure 1:
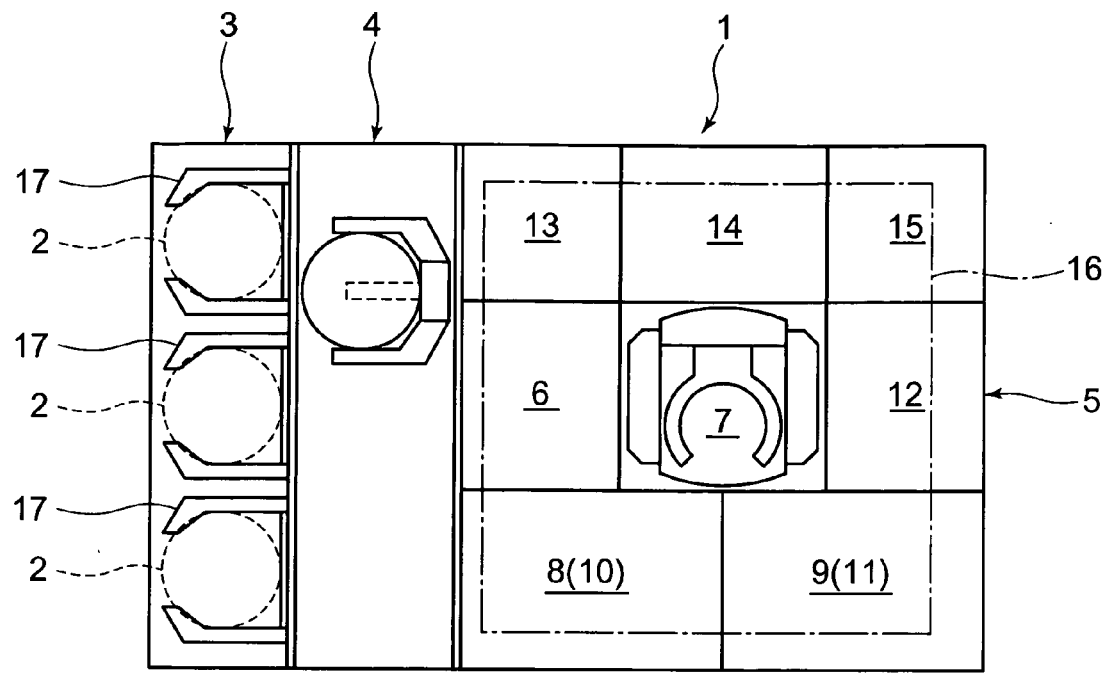
FIG. 1 is a plane view showing a layout of a substrate cleaning system according to an embodiment of the present invention.
Figure 2:
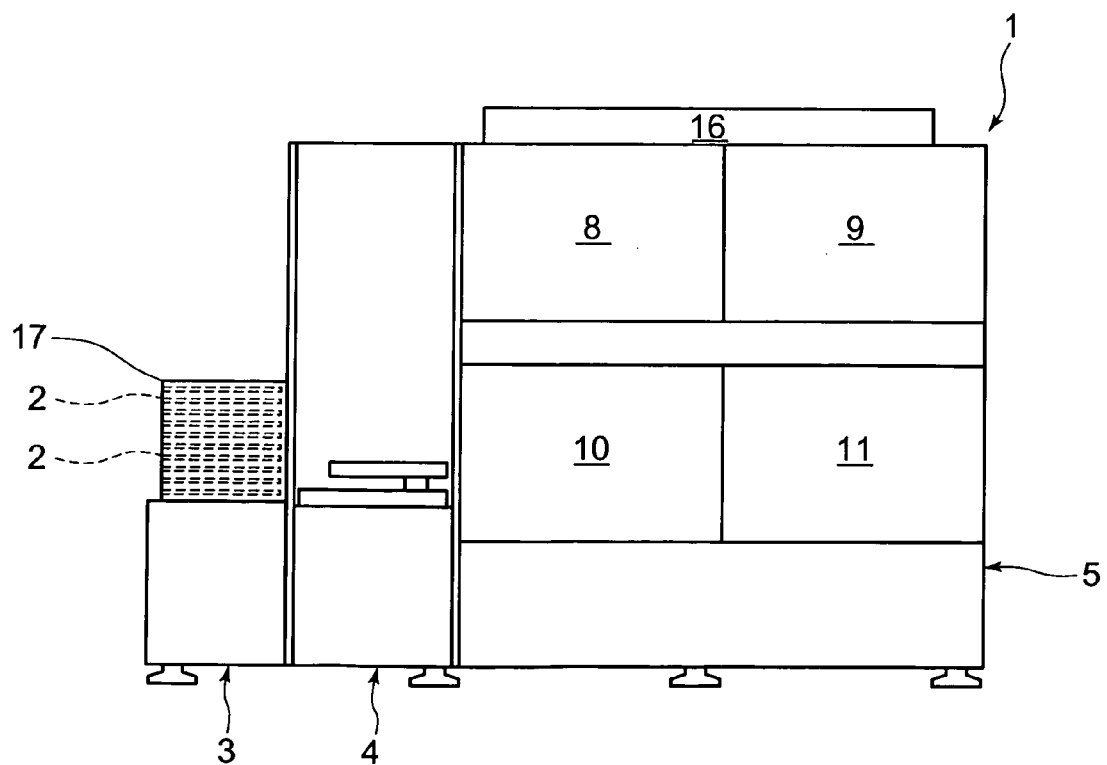
FIG. 2 is a side view of the substrate cleaning system shown in FIG. 1.

As shown in FIGS. 1 and 2, a substrate cleaning system 1 comprises, at the rear (the right-hand side in FIG. 1) of a substrate carrying-in-and-out unit 3 for carrying wafers 2, substrates, in or out, a substrate carrying unit 4 for carrying wafers 2 one by one, and, at the rear of this substrate carrying unit 4, a substrate processing unit 5 in which wafers 2 are subjected to various treatment such as cleaning and drying.

In the substrate processing unit 5, a substrate delivering and turning unit 6 for delivering a wafer 2 and turning over a wafer 2 is placed at the rear of the substrate carrying unit 4. At the rear of this substrate delivering and turning unit 6 is placed a main carrier unit 7 with which a wafer 2 is carried within the substrate processing unit 5. On one side of the main carrier unit 7, substrate cleaning units 8, 9, 10, and 11 for cleaning wafers 2 are placed in two rows, two of them in the upper row and the other two in the lower row. At the rear of the main carrier unit 7, a substrate drying and cooling unit 12 for drying and cooling a wafer 2 is placed. Further, on the other side of the main carrier unit 7, a chemical storage unit 13, an electrical wiring unit 14, and a machine control unit 15 are placed side by side in this order. Furthermore, as shown in FIG. 2, a filter fan unit 16 is placed on top of these units 6 to 15.

The substrate cleaning units 8 and 9 in the upper row are for cleaning the front side (main surface: the side on which a circuit will be formed) of a wafer 2. The substrate cleaning units 10 and 11 in the lower row are for cleaning the backside of a wafer 2. The substrate cleaning units 8 and 10 placed on the front and the substrate cleaning units 9 and 11 placed behind them are symmetrical to each other in internal structure.

In the substrate cleaning system 1, a wafer 2 is processed in the following manner, for example. First, out of a carrier 17 loaded with a plurality of wafers 2, held in the substrate carrying in and out unit 3, the substrate carrying unit 4 takes the wafers 2 one by one and carries the wafers 2 to the substrate delivering and turning unit 6. The main carrier unit 7 then carries the wafer 2 from the substrate delivering and turning unit 6 to the substrate cleaning unit 10 (11) in the lower row. In the substrate cleaning unit 10 (11) in the lower row, the backside of the wafer 2 is cleaned. Thereafter, the main carrier unit 7 carries again the wafer 2 to the substrate delivering and turning unit 6. The substrate delivering and turning unit 6 then turns over the wafer 2. Thereafter, the main carrier unit 7 carries the wafer 2 to the substrate cleaning unit 8 (9) in the upper row. In this upper substrate cleaning unit 8 (9), the front side of the wafer 2 is cleaned. The main carrier unit 7 then carries the wafer 2 to the substrate drying and cooling unit 12. The wafer 2 is dried and cooled in this substrate drying and cooling unit 12. The main carrier unit 7 carries again the wafer 2 to the substrate delivering and turning unit 6. The substrate carrying unit 4 then carries the wafer 2 from the substrate delivering and turning unit 6 to the carrier 17 in the substrate carrying in and out unit 3.

Next, the structure of the substrate cleaning units 8, 9, 10, 11 for cleaning wafers 2, contained in the substrate cleaning system 1, will be specifically described. In the following description, the structure of the substrate cleaning unit 11 in the lower row, situated on the backside, will be explained. The substrate cleaning unit 10 in the lower row, situated on the front side, is laterally symmetrical to the substrate cleaning unit that will be described hereinafter. Further, the substrate cleaning units 8 and 9 in the upper row are different from the substrate cleaning unit that will be described below only in wafer 2 supporting structure.

Figure 3:
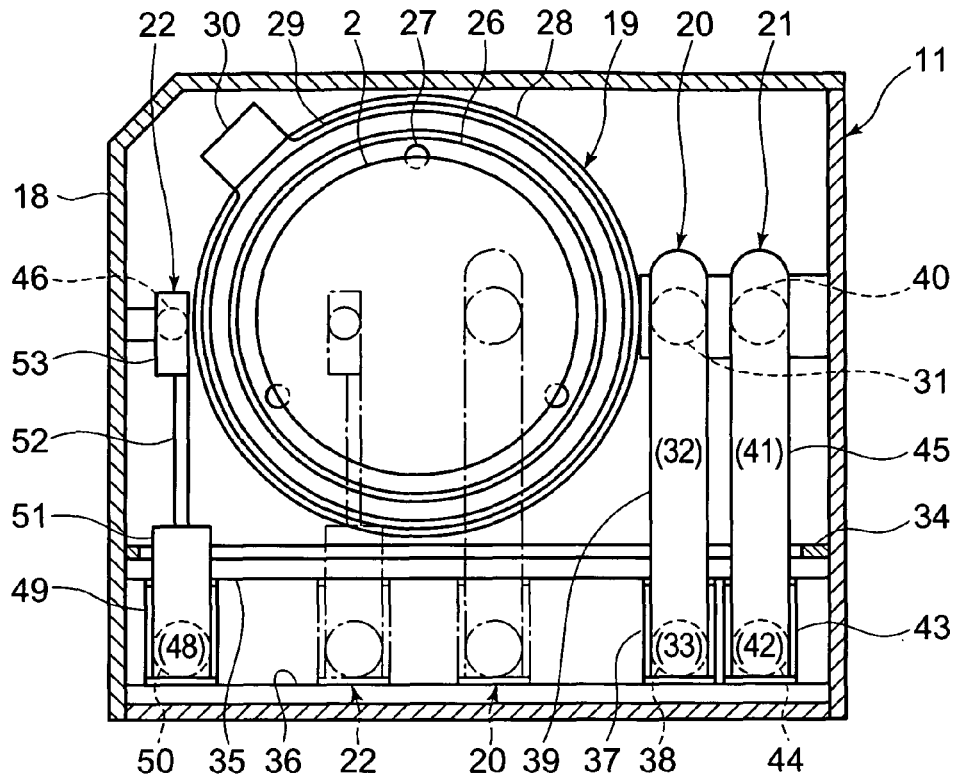
FIG. 3 is a plane view showing the internal structure of a substrate cleaning unit in a substrate cleaning system.
Figure 4:
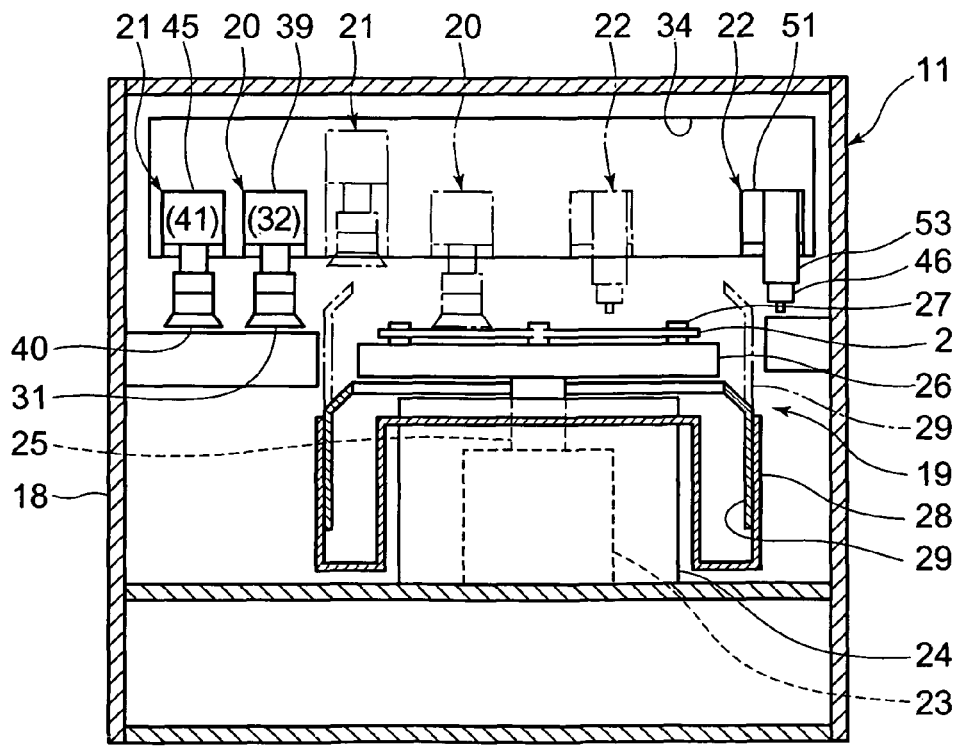
FIG. 4 is a front view showing the internal structure of the substrate cleaning unit shown in FIG. 3.
Figure 5:
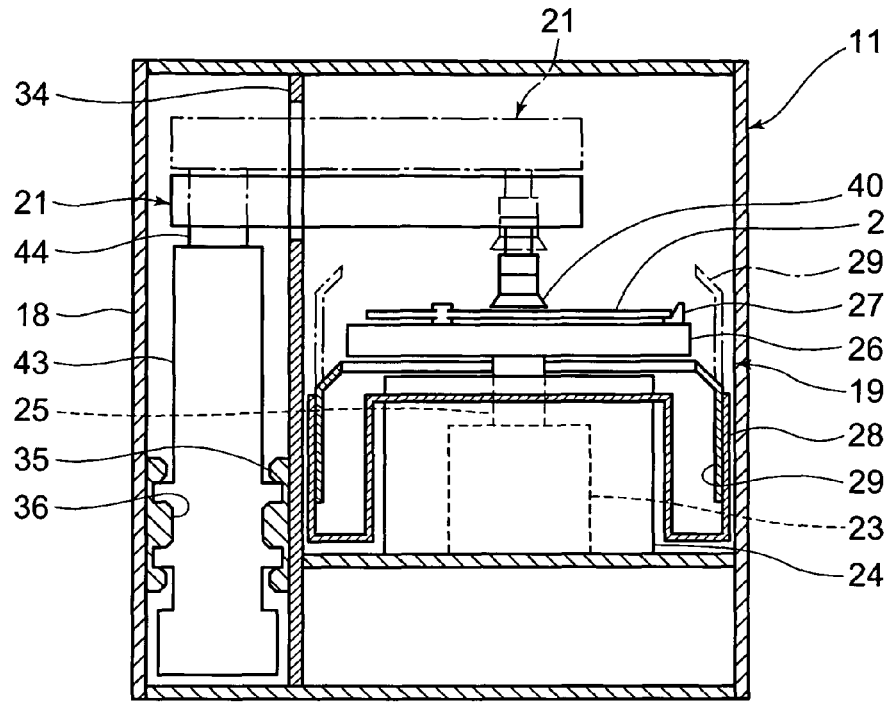
FIG. 5 is a side view showing the internal structure of the substrate cleaning unit shown in FIG. 3.

In the substrate cleaning unit 11 in this embodiment, a substrate supporting means 19 for supporting and rotating a wafer 2 is placed in a casing 18 in the shape of a nearly rectangular box, as shown in FIGS. 3 to 5. At the rear of this substrate supporting means 19, a first cleaning device 20 and a second cleaning device 21 that are for cleaning the backside of a wafer 2 by brushing are placed. On the other hand, a third cleaning device 22 for cleaning the backside of a wafer 2 with ultrasonic is placed on the front of the substrate supporting means 19. Each cleaning device 20, 21 and 22 has a cleaning member that will face a wafer 2 to be processed and that can get close to or apart from the wafer 2.

The structure of the substrate supporting means 19 and the first, second, and third cleaning devices 20, 21 and 22 that constitute the substrate cleaning unit 11 will be specifically described hereinafter.

First, the structure of the substrate supporting means 19 will be described. The substrate supporting means 19 comprises a base 24 with a built-in rotating means 23 for rotating a wafer 2, and a rotating shaft 25 projecting from the center of the upper surface of the base 24. To the upper end of this rotating shaft 25, a disc-shaped turntable 26 is attached. Equally spaced three small support pieces 27 for supporting a wafer 2 at its peripheral edge are attached to the circumference of the upper surface of this turntable 26.

To the base 24 of the substrate supporting means 19 is also fixed an annular, hollow wastewater container 28. The inner wall of the wastewater container 28 holds an annular cup 29 in such a fashion that the cup can go up and down. An elevating means 30 is linked to this cup 29.

The substrate supporting means 19 supports a wafer 2, placed on the upper surface of the turntable 26, by means of the small support pieces 27. While the cleaning device is cleaning the wafer 2, the rotating means 23 rotates the turntable 26 together with the wafer 2. When the wafer 2 is carried, the cup 29 is downed by the elevating means 30. During the cleaning of the wafer 2, the cup 29 elevated by the elevating means 30 is retained as it is so that the cleaning fluid is recovered in the wastewater container 28.

Next, the structure of the first cleaning device 20 will be described. The first cleaning device 20 has a rotary brush 31 as the cleaning member. The first cleaning device 20 comprises a driving means 32 for revolving (rotating) the rotary brush 31 and a moving means 33 for moving the first cleaning device 20 itself. The first cleaning device 20 revolves the rotary brush 31 by means of the driving means 32 while moving by means of the moving means 33. By moving along the upper surface of the wafer 2 while revolving the rotary brush 31, the first cleaning device 20 cleans the wafer 2 by brushing.

The first cleaning device 20 comprises a moving body 37 with the built-in moving means 33, an elevating shaft 38 projecting from the top of the moving body 37, and an arm 39 whose end is fixed to the upper end of the elevating shaft 38. The moving body 37 is attached to a pair of guide rails 35 and 36 fixed to the casing 18 and a partition 34 so that the moving body 37 can self-travel along the guide rails. The arm 39 contains in it the driving means 32. The rotary brush 31 is downwardly fixed to the head of the arm 39 such that the rotary brush 31 can be rotated by the driving means 32. The arm 39 can go up and down along the elevating shaft 38 together with the rotary brush 31 and the driving means 32.

Next, the structure of the second cleaning device 21 will be described. Like the first cleaning device 20, the second cleaning device 21 has a rotary brush 40 as the cleaning member. The second cleaning device 21 comprises a driving means 41 for revolving (rotating) the rotary brush 40 and a moving means 42 for moving the second cleaning device 21 itself. The second cleaning device 21 revolves the rotary brush 40 by means of the driving means 41 while moving by means of the moving means 42. By moving along the upper surface of the wafer 2 while rotating the rotary brush 40, the second cleaning device 21 cleans the wafer 2 by brushing.

The second cleaning device 21 comprises a moving body 43 with the built-in moving means 42, an elevating shaft 44 projecting from the top of the moving body 43, and an arm 45 whose end is fixed to the upper end of the elevating shaft 44. The moving body 43 is attached to the guide rails 35 and 36 so that the moving body 43 can self-travel along the guide rails. The arm 45 contains in it the driving means 41. The rotary brush 40 is downwardly fixed to the head of the arm 45 such that the rotary brush 40 can be rotated by the driving means 41. The arm 45 can go up and down along the elevating shaft 44 together with the rotary brush 40 and the driving means 41.

Next, the structure of the third cleaning device 22 will be described. The third cleaning device 22 is configured so that the third cleaning device 22 cleans a wafer 2 with ultrasonic by traveling along the upper surface of the wafer 2 by means of the moving means 48, while letting a nozzle 46 eject an ultrasonically vibrated cleaning fluid over the wafer 2. Namely, the third cleaning device 22 has the nozzle 46 as the cleaning member.

The third cleaning device 22 comprises a moving body 49 with the built-in moving means 48, an elevating shaft 50 projecting from the top of the moving body 49, and an arm 52 whose end is fixed to the upper end of the elevating shaft 50. The moving body 49 is attached to the guide rails 35 and 36 so that the moving body 49 can self-travel along the guide rails. The nozzle 46 is downwardly fixed to the head of the arm 52. The arm 52 can go up and down along the elevating shaft 50 together with the nozzle 46.

Figure 6:
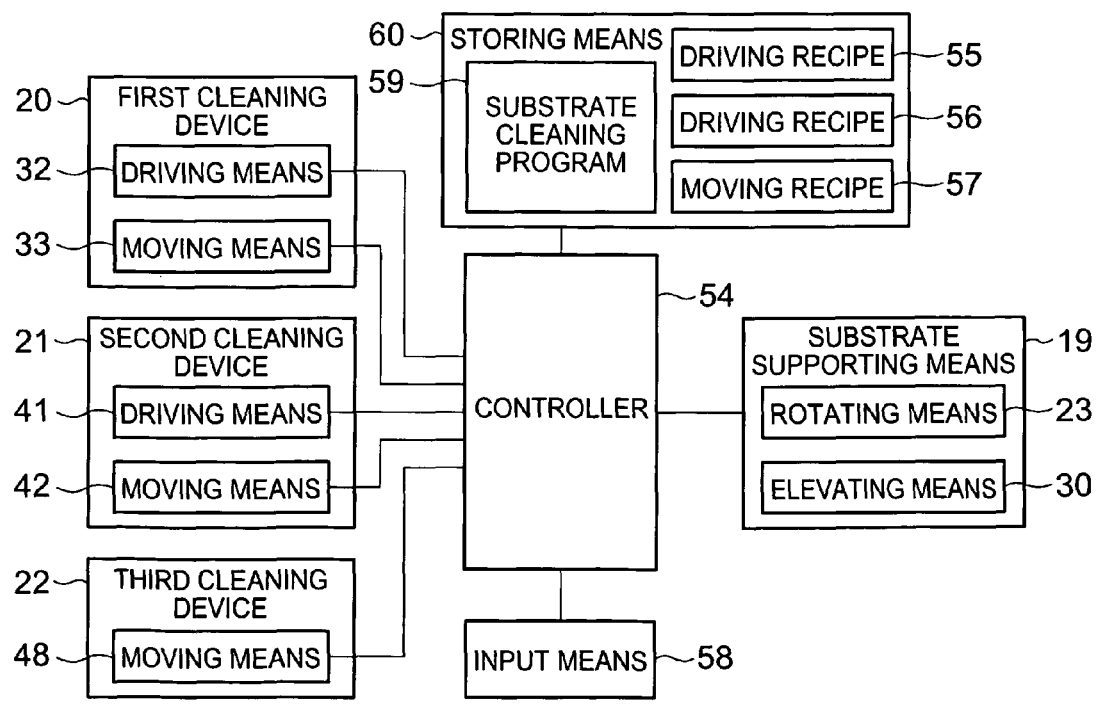
FIG. 6 is a diagram for explaining a control system.

As shown in FIG. 6, the substrate supporting means 19 that is a component of the substrate cleaning unit 11, and the component parts of the first, second, and third cleaning devices 20, 21 and 22, specifically, the rotating means 23, the elevating means 30, the driving means 32, 41, and the moving means 33, 42, 48, are connected to a controller 54. This controller 54 controls the driving of each component.

As shown in FIG. 6, the controller 54 is connected to an input means 58 of inputting the driving recipes 55, 56 and 57 that prescribe the operation of the cleaning devices 20, 21 and 22 in the order of time. Further, as shown in FIG. 6, the controller 54 is also connected to a recording medium 60 that stores a substrate cleaning program 59 with which the substrate cleaning system 1 carries out cleaning operation, as well as the driving recipes 55, 56 and 57 for the cleaning devices 20, 21 and 22. Any medium is herein useful as the recording medium 60 as long as it can store the substrate cleaning program 59, and either a memory such as ROM or RAM, or a disc-shaped recording medium such as a hard disc or CD-ROM may be used.

The method of controlling the driving of the first, second, and third cleaning devices 20, 21 and 22 by the controller 54 will be described with reference to the following three Examples.

In the following description, the retreat position is the position, defined in the horizontal direction and set outside a wafer 2, in which the cleaning device 20, 21 and 22 is held when the cleaning device 20, 21 and 22 is not cleaning the wafer 2, i.e., before the cleaning device 20, 21 and 22 carries out cleaning operation. The cleaning-starting position is the position, defined in the horizontal direction, in which the cleaning device 20, 21 and 22 starts cleaning a wafer 2. The cleaning end position is the position, defined in the horizontal direction, in which the cleaning device 20, 21 and 22 completes the cleaning of the wafer 2. The speed-change position is the position, defined in the horizontal direction, in which the cleaning device 20, 21 and 22 changes its speed in the course of the cleaning of the wafer 2. The waiting position is the position, defined in the horizontal direction, in which the cleaning device 20, 21 and 22 is kept waiting temporarily so that the cleaning devices 20, 21 and 22 do not interfere with each other (so that they do not collide with each other, for example).

Figure 7:
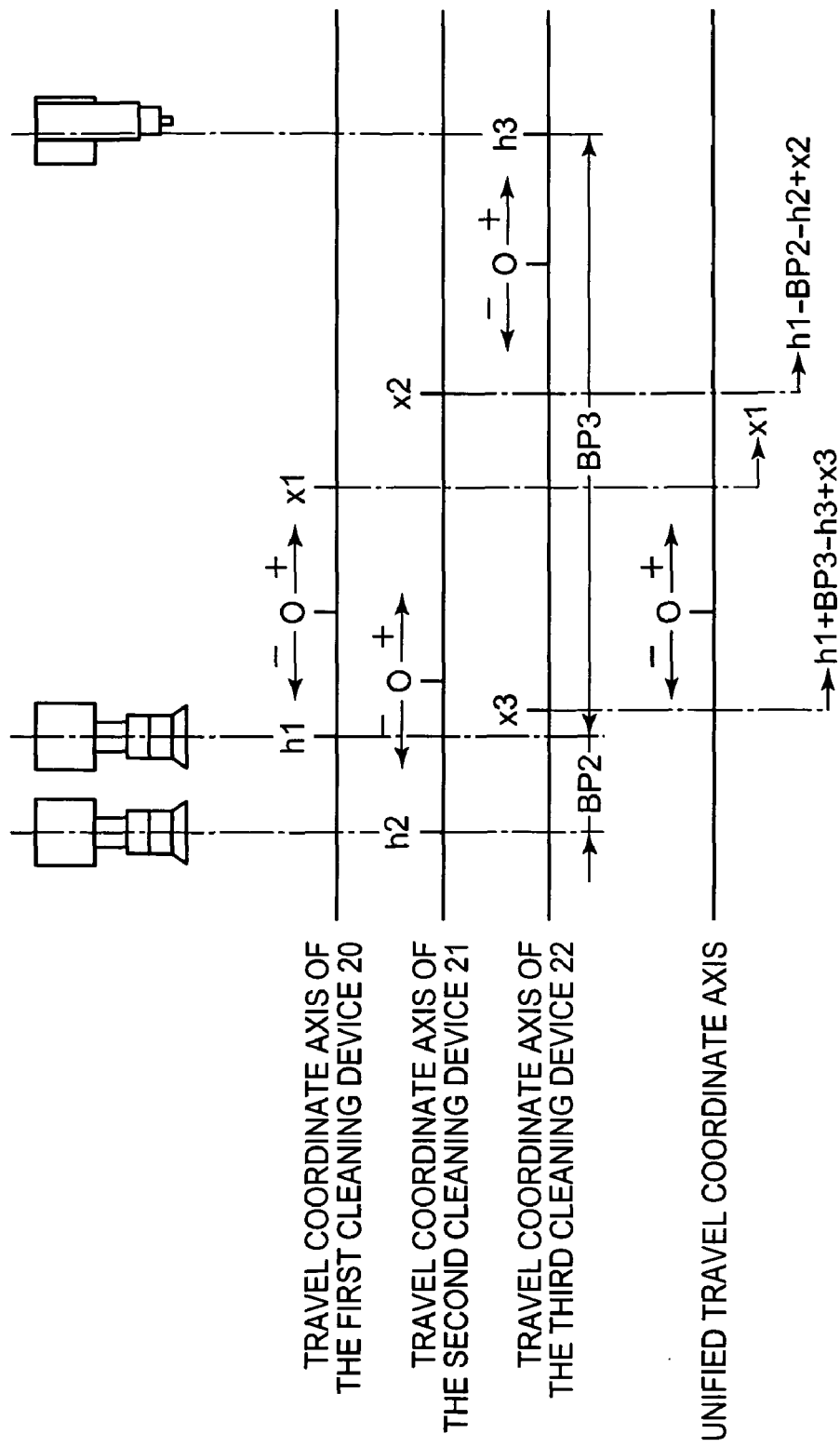
FIG. 7 is a diagram for explaining a unified travel coordinate axis.

The controller 54 controls the cleaning devices 20, 21 and 22 by the use of travel coordinate axes which are characteristic of the cleaning devices 20, 21 and 22, respectively, as shown in FIG. 7. Further, the controller 54 sets the interference region and the waiting time, which will be described later, by the use of a unified travel coordinate axis obtained by unifying the travel coordinate axes, each of which is characteristic of one of the cleaning devices 20, 21 and 22. For the unified travel coordinate axis, one of the travel coordinate axes characteristic of the cleaning devices 20, 21 and 22, e.g., the travel coordinate axis of the cleaning device having the highest priority that will be described later, may be used. Alternatively, a coordinate axis independent of the travel coordinate axes of the cleaning devices 20, 21 and 22 may also be used. In the following description, the travel coordinate axis characteristic of the first cleaning device 20 is used as the unified travel coordinate axis, and the coordinate axis characteristic of the second cleaning device 21 and the coordinate axis characteristic of the third cleaning device 22 are converted into the unified travel coordinate axis. Specifically, when the retreat positions of the cleaning devices 20, 21 and 22 are denoted by h1, h2, and h3 on the respective travel coordinate axes, the distance between the retreat positions of the first and second cleaning devices 20 and 21 is denoted by BP2, and the distance between the retreat positions of the first and third cleaning devices 20 and 22 is denoted by BP3, x1 on the travel coordinate axis characteristic of the first cleaning device 20 is denoted by x1 even on the unified travel coordinate axis. x2 on the travel coordinate axis characteristic of the second cleaning device 21 is denoted by (h1−BP2−h2+x2) on the unified travel coordinate axis. Further, x3 on the travel coordinate axis characteristic of the third cleaning device 22 is denoted by (h1+BP3−h3+x3) on the unified travel coordinate axis.

EXAMPLE 1

The precondition of Example 1 is that the driving recipes 55, 56 and 57 as shown in FIG. 8, made by an operator, have been previously recorded in the recording medium 60 by means of the input means 58.

The driving recipe 55 as shown in FIG. 8A charts the operation of the first cleaning device 20 prescribed in the order of time. In this Example, the operation of the first cleaning device 20 is as follows: the first cleaning device 20 in the retreat position P1 is elevated, as the first step. Next, the first cleaning device 20 elevated is, as the second step, made to move as it is from the retreat position P1 to the cleaning-starting position P2 at a speed of 150 mm/s. The first cleaning device 20 in the cleaning-starting position P2 is then downed, as the third step. The first cleaning device 20 downed is then made to move as it is from the cleaning-starting position P2 to the speed-change position P3 at a speed of 15 mm/s, as the fourth step. Thereafter, the first cleaning device 20 downed is made to move as it is from the speed-change position P3 to the cleaning end position P4 at a speed of 10 mm/s, as the fifth step. The first cleaning device 20 in the cleaning end position P4 is then elevated, as the sixth step. The first cleaning device 20 elevated is made to move as it is from the cleaning end position P4 to the retreat position P1 at a speed of 150 mm/s, as the seventh step. The first cleaning device 20 in the retreat position P1 is then downed, as the eighth step.

The driving recipe 56 as shown in FIG. 8B charts the operation of the second cleaning device 21 prescribed in the order of time. In this Example, the second cleaning device 21 in the retreat position P5 is downed and held as it is in the position, as the first step. This recipe prescribes no step after this, so that the state of the second cleaning device 21 in the first step is maintained.

The driving recipe 57 as shown in FIG. 8C charts the operation of the third cleaning device 22 prescribed in the order of time. In this Example, the operation of the third cleaning device 22 is as follows: the third cleaning device 22 in the retreat position P6 is elevated, as the first step. Next, the third cleaning device 22 elevated is, as the second step, made to move as it is from the retreat position P6 to the cleaning-starting position P7 at a speed of 150 mm/s. The third cleaning device 22 in the cleaning-starting position P7 is downed, as the third step. Thereafter, the third cleaning device 22 downed is made to move as it is from the cleaning-starting position P7 to the speed-change position P8 at a speed of 15 mm/s, as the fourth step. The third cleaning device 22 downed is then made to move as it is from the speed-change position P8 to the cleaning end position P9 at a speed of 10 mm/s, as the fifth step. The third cleaning device 22 in the cleaning end position P9 is elevated, as the sixth step. The third cleaning device 22 elevated is made to move as it is from the cleaning end position P9 to the retreat position P6 at a speed of 150 mm/s, as the seventh step. The third cleaning device 22 in the retreat position P6 is then downed, as the eighth step.

The controller 54 controls the driving of the cleaning devices 20, 21 and 22 in accordance with the driving recipes 55, 56 and 57, respectively. However, if the controller 54 controls the driving of the cleaning devices 20, 21 and 22 faithfully following the driving recipes 55, 56 and 57, respectively, the first cleaning device 20 and the third cleaning device 22 collide with each other right after starting cleaning and thus interfere with each other. The cleaning devices 20, 21 and 22 have so far been prevented from interfering with each other by making the input means refuse to input the driving recipes 55, 56 and 57 that cause the interference, or by executing the driving recipes 55, 56 and 57 individually one by one. In such a conventional manner, it is necessary to make new driving recipes 55, 56 and 57, which requires time and labor. Moreover, there is the possibility that the time needed for cleaning increases to decrease the throughput of the substrate-cleaning process.

Figure 9:
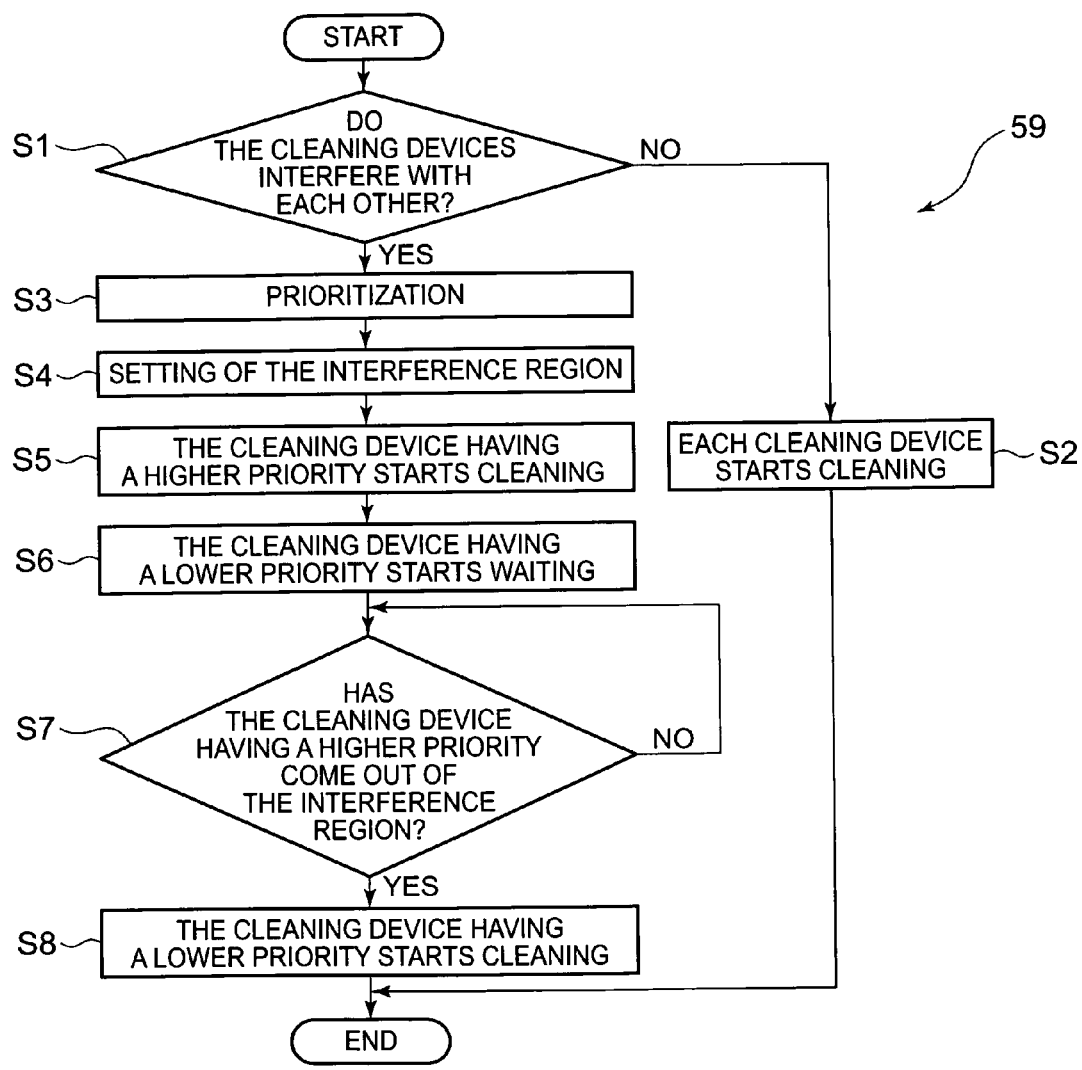
FIG. 9 is a flow chart showing a substrate cleaning program.

For this reason, the controller 54 controls the driving of the cleaning devices 20, 21 and 22 in accordance with the substrate cleaning program 59 stored in the recording medium 60. This program 59 makes the cleaning devices 20, 21 and 22 operate without interfering with each other. The substrate cleaning program 59 is made following the flow chart shown in FIG. 9.

In this substrate cleaning program 59, it is first judged, from the driving recipes 55, 56 and 57 for the cleaning devices 20, 21 and 22, whether the cleaning devices 20, 21 and 22 will interfere with each other (judging interference step S1).

Specifically, the distance between each two of the cleaning devices 20, 21 and 22 is calculated and judged whether it is longer at any point of time than the distance between the two cleaning devices when they get as close to each other as possible without actually coming into contact (this distance is referred to as "minimum accessible distance"). If the distance between each two of the cleaning devices is always longer than the minimum accessible distance, it is judged that no interference will occur between any two of the cleaning devices. On the other hand, if the distance between any two of the cleaning devices is shorter than the minimum accessible distance at a certain point of time, it is judged that the two of the cleaning devices will interfere with each other.

In the substrate cleaning program 59, if it is judged in the judging interference step S1 that the cleaning devices 20, 21 and 22 will cause no interference, they are made to carry out cleaning operation in accordance with the driving recipes 55, 56 and 57, respectively (starting cleaning step S2). On the other hand, if it is judged that the cleaning devices will cause interference, the following steps S3 to S8 are performed.

The substrate cleaning program 59 prioritizes the first, second and third cleaning devices 20, 21 and 22 so as to determine the order in which they start cleaning (prioritizing step S3). For example, this order may be determined beforehand as follows: the first, second, and third priorities are given to the first, second, and third cleaning devices 20, 21 and 22, respectively. Alternatively, by means of the input means 58, the operator may input the priorities of the cleaning devices 20, 21 and 22. In this Example, the first priority is given to the first cleaning device 20, the second priority is given to the third cleaning device 22, and the third priority is given to the second cleaning device 21. In the following description, since the second cleaning device 21 is held in the retreat position P5 as prescribed in the driving recipe 56 and does not carry out cleaning operation, only the control of driving of the first and third cleaning devices 20 and 22 will be explained. However, in the case where the second cleaning device 21 also carries out cleaning operation, the driving of the first cleaning device 20 in relation to the third cleaning device 22 may be first controlled in the following manner, and the driving of the third cleaning device 22 in relation to the second cleaning device 21 may be then controlled in the same manner.

Next, on the basis of the driving recipe 55 for the first cleaning device 20 having a higher priority and the driving recipe 57 for the third cleaning device 22 having a lower priority, the substrate cleaning program 59 sets the interference region 61 (see FIGS. 10 and 11) in which the first cleaning device 20 having the higher priority and the third cleaning device 22 having the lower priority can interfere with each other (setting interference region step S4).

In this embodiment, the first cleaning device 20 and the third cleaning device 22 interfere with each other only in the horizontal direction along the guide rails 35 and 36. Therefore, in this embodiment, the interference region is set only in the horizontal direction.

Specifically, on the basis of the driving recipe 55 for the first cleaning device 20 and the driving recipe 57 for the third cleaning device 22, it is judged whether the first cleaning device 20 having the higher priority and the third cleaning device 22 having the lower priority will interfere with each other. In this Example, the first cleaning device 20 interferes with the third cleaning device 22 while moving from the cleaning-starting position P2 to a position at a given distance from the cleaning-starting position P2 (this position is referred to as passing position P11), so that the region between the cleaning-starting position P2 and the passing position P11 is set as the interference region 61. In this Example, the first cleaning device 20 and the third cleaning device 22 interfere with each other in the following way: the end of the first cleaning device 20, nearest to the third cleaning device 22 (the left-most edge face of the moving body 37 in the top plane view shown in FIG. 3) collides with the end of the third cleaning device 22, nearest to the first cleaning device 20 (the right-most edge face of the moving body 49 in the top plane view shown in FIG. 3). Therefore, a virtual region, stretching in the horizontal direction, ranging from the position of the end, nearest to the third cleaning device 22, of the first cleaning device 20 positioning on the cleaning-starting position P2, to the position of the end, nearest to the third cleaning device 22, of the first cleaning device 20 positioning in the passing position P11, is set as the interference region 61. In other words, the interference region is set so that it ranges from the position of the end, nearest to the third cleaning device 22 having the lower priority, of the first cleaning device 20 having the higher priority, positioning in the cleaning-starting position P2, to the position of the end, nearest to the first cleaning device 20 having the higher priority, of the third cleaning device 22 having the lower priority, positioning in the cleaning-starting position P7.

Next, the substrate cleaning program 59 makes the first cleaning device 20 having the higher priority start cleaning a wafer 2 from the predetermined cleaning-starting position P2 towards the periphery of the wafer 2 (starting higher priority cleaning device step S5).

Specifically, the substrate cleaning program 59 makes the controller 54 control the driving of the first cleaning device 20 so that the first cleaning device 20 successively performs the first to eighth steps in the driving recipe 55. Namely, the first cleaning device 20 in the retreat position P1 is elevated. It is then made to move from the retreat position P1 to the cleaning-starting position P2 at a speed of 150 mm/s. Thereafter, the first cleaning device 20 in the cleaning-starting position P2 is downed. Subsequently, it is made to move from the cleaning-starting position P2 to the speed-change position P3 at a speed of 15 mm/s. The first cleaning device 20 is then made to move from the speed-change position P3 to the cleaning end position P4 at a speed of 10 mm/s. Thereafter, the first cleaning device 20 in the cleaning end position P4 is elevated. It is made to move from the cleaning end position P4 to the retreat position P1 at a speed of 150 mm/s. The first cleaning device 20 in the retreat position P1 is then downed (see FIGS. 10 and 11).

Simultaneously with the above-described control of driving of the first cleaning device 20, the substrate cleaning program 59 keeps the third cleaning device 22 having the lower priority waiting in the waiting position P10 set outside the interference region 61 until the first cleaning device 20 having the higher priority has come out of the interference region 61 (keeping lower priority cleaning device waiting step S6).

In this embodiment, the retreat position P1 of the first cleaning device 20 having the higher priority is on one side of a wafer 2, horizontally apart from the wafer 2 (the right-hand side in the top plane view shown in FIG. 3), while the retreat position P6 of the third cleaning device 22 having the lower priority is on the other side of the wafer 2, horizontally apart from the wafer 2 (the left-hand side in the top plane view shown in FIG. 3). Further, in this embodiment, each cleaning device starts cleaning a wafer 2 from the approximate center of the wafer 2 and cleans the wafer 2 while moving from the center of the wafer 2 towards the side on which the retreat position of the cleaning device is set. Furthermore, in this embodiment, the waiting position P10 in which the third cleaning device 22 having the lower priority is kept waiting is set between the retreat position P6 and the cleaning-starting position P7, on a horizontal line connecting these two positions P6 and P7, right before the interference region 61. Namely, the waiting position P10 is set so that the third cleaning device 22 can get horizontally apart from the first cleaning device 20 sitting in the cleaning-starting position P2, to the other side by the minimum accessible distance at which the third cleaning device 22 does not interfere with the first cleaning device 20. In other words, the waiting position P10 is set so that the cleaning device 22 having the lower priority can get apart from the cleaning device 20 having the higher priority, sitting in the cleaning-starting position P2, to the side opposite to the direction in which the cleaning device 20 having the higher priority moves from its cleaning-starting position P2 while the cleaning device 20 is cleaning a wafer, by the minimum accessible distance at which the cleaning device 22 having the lower priority does not interfere with the cleaning device 20 having the higher priority.

Figure 10:
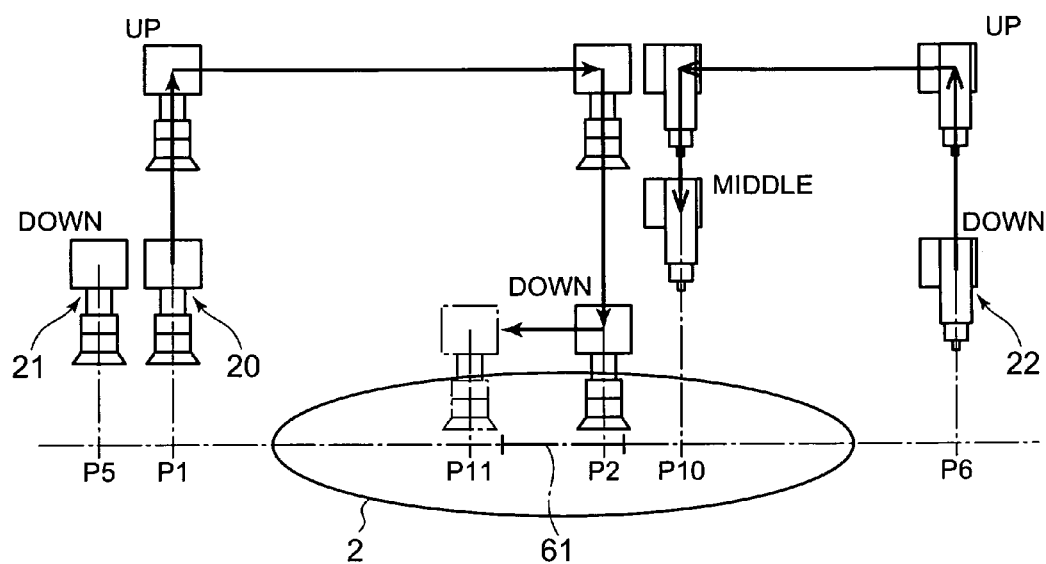
FIG. 10 is a diagram for explaining the operation of cleaning devices.

Specifically, as shown in FIG. 10, the third cleaning device 22 in the retreat position P6 is elevated. It is then made to move from the retreat position P6 to the waiting position P10 at a speed of 150 mm/s. Thereafter, the third cleaning device 22 in the waiting position P10 is downed towards the wafer 2.

Next, in the substrate cleaning program 59, it is judged whether the first cleaning device 20 having the higher priority has come out of the interference region 61 (judging interference region step S7).

Specifically, first a signal indicating the position of the first cleaning device 20 is received from the moving means 33 of the first cleaning device 20. By comparing the position of the first cleaning device 20, indicated by the signal, and the passing position P11, it is judged whether the first cleaning device 20 has come out of the interference region 61. Alternatively, the time needed for the first cleaning device 20 to reach the passing position P11 may be calculated beforehand on the basis of the traveling distance and speed, and whether the first cleaning device 20 has reached the passing position P11 may be judged on the basis of the time measured by a timer or the like built in the controller 54.

Next, after the first cleaning device 20 having the higher priority has come out of the interference region 61, the substrate cleaning program 59 makes the third cleaning device 22 having the lower priority start cleaning the wafer 2 from the predetermined cleaning-starting position P7 towards the periphery of the wafer 2 (starting lower priority cleaning device step S8).

Figure 11:
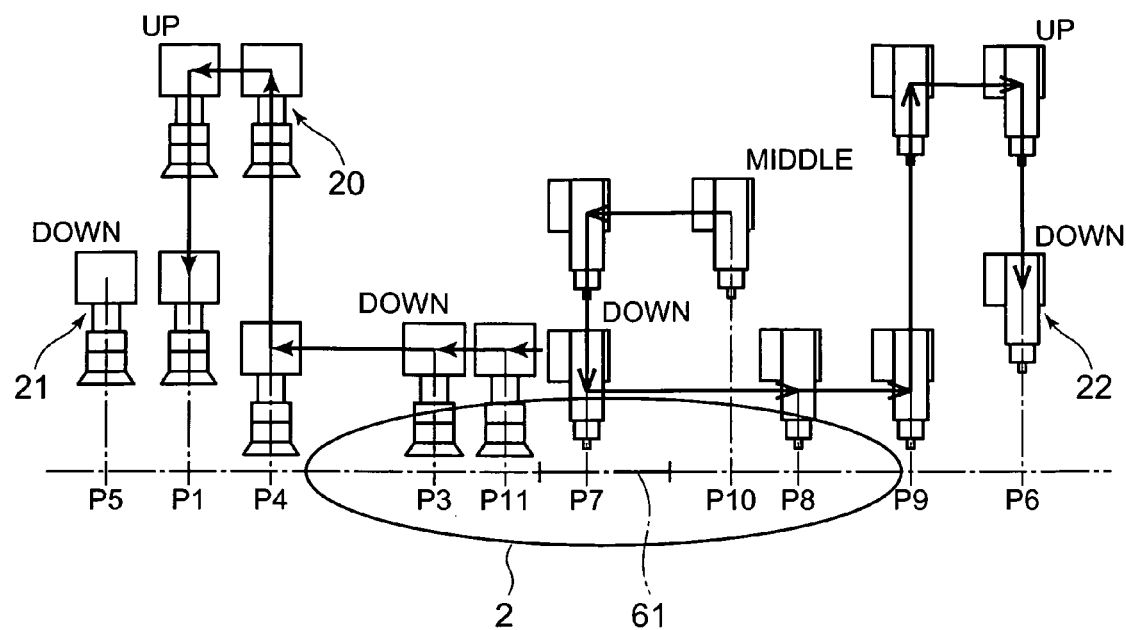
FIG. 11 is a diagram for explaining the operation of cleaning devices.

Specifically, as shown in FIG. 11, the third cleaning device 22 is first made to move from the waiting position P10 to the cleaning-starting position P7 at a speed of 150 mm/s. The third cleaning device 22 in the cleaning-starting position P7 is then downed. Thereafter, it is made to move from the cleaning-starting position P7 to the speed-change position P8 at a speed of 15 mm/s. The third cleaning device 22 is then made to move from the speed-change position P8 to the cleaning end position P9 at a speed of 10 mm/s. The third cleaning device 22 in the cleaning end position P9 is elevated. It is made to move from the cleaning end position P9 to the retreat position P6 at a speed of 150 mm/s. Thereafter, the third cleaning device 22 in the retreat position P6 is downed.

In the substrate cleaning program 59, by performing the above-described steps S1 to S8, the driving of the first cleaning device 20 and the driving of the third cleaning device 22 are simultaneously controlled to clean a wafer 2. Therefore, as for the third cleaning device 22, its driving is controlled in accordance with the driving recipe 62 shown in FIG. 12. Namely, the third cleaning device 22 in the retreat position P6 is elevated, as the first step. Next, the third cleaning device 22 elevated is, as the second step, made to move as it is from the retreat position P6 to the waiting position P10 at a speed of 150 mm/s. Thereafter, the third cleaning device 22 in the waiting position P10 is downed, as the third step. It is held in the waiting position P10 for a predetermined time (the time needed for the first cleaning device 20 to reach the passing position P11 and come out of the interference region 61), as the fourth step. The third cleaning device 22 downed is made to move as it is from the waiting position P10 to the cleaning-starting position P7 at a speed of 150 mm/s, as the fifth step. Thereafter, it is further downed towards the wafer 2, as the sixth step. The third cleaning device 22 downed is made to move as it is from the cleaning-starting position P7 to the speed-change position P8 at a speed of 15 mm/s, as the seventh step. The third cleaning device 22 downed is then made to move as it is from the speed-change position P8 to the cleaning end position P9 at a speed of 10 mm/s, as the eighth step. The third cleaning device 22 in the cleaning end position P9 is elevated, as the ninth step. The third cleaning device 22 elevated is made to move as it is from the cleaning end position P9 to the retreat position P6 at a speed of 150 mm/s, as the tenth step. The third cleaning device 22 in the retreat position P6 is downed, as the eleventh step.

Therefore, after the setting interference region step S5, even if the substrate cleaning program 59 automatically makes the above-described driving recipe 62 and controls the driving of the first cleaning device 20 faithfully following the driving recipe 55 that has been input and the driving of the third cleaning device 22 faithfully following the driving recipe 62 that has been automatically made. As a result of these, the above-described steps S3 to S8 are performed.

As described above, the substrate cleaning system 1 performs the method of cleaning a wafer 2 in accordance with the substrate cleaning program 59. Namely, a plurality of the cleaning devices 20, 21 and 22 are prioritized, and, on the basis of the driving-recipe 55 for the cleaning device 20 having the higher priority and the driving recipe 57 for the cleaning device 22 having the lower priority, the interference region 61 in which the cleaning device 20 having the higher priority and the cleaning device 22 having the lower priority interfere with each other is set. The cleaning device 20 having the higher priority is made to start cleaning a wafer 2 from the predetermined cleaning-starting position P2 towards the periphery of the wafer 2, while the cleaning device 22 having the lower priority is kept waiting in the waiting position P10 set outside the interference region 61 until the cleaning device 20 having the higher priority has come out of the interference region 61. After the cleaning device 20 having the higher priority has come out of the interference region 61, the cleaning device 22 having the lower priority is made to start cleaning the wafer 2 from the predetermined cleaning-starting position P7 towards the periphery of the wafer 2.

Therefore, in the above-described substrate cleaning system 1, even when a plurality of the cleaning devices 20, 21 and 22 interfere with each other when driven in accordance with the driving recipes 55, 56 and 57 made by an operator, respectively, a wafer 2 can be cleaned by simultaneously operating a plurality of the cleaning devices 20, 21 and 22 while avoiding the interference automatically. The time needed for cleaning a wafer 2 can thus be decreased. Consequently, the throughput of the substrate-cleaning process in the substrate cleaning system 1 can be improved. Moreover, the operator need not make driving recipes 55, 56 and 57 again. Therefore, the time and labor needed to make driving recipes 55, 56 and 57 can be reduced.

In particular, in the above-described substrate cleaning system 1, the cleaning device 22 having the lower priority is kept waiting not in its retreat position P6 but in a position horizontally apart from the retreat position P6 towards its cleaning-starting position P7 (position in the horizontal direction: the waiting position 10). Therefore, according to the substrate cleaning system 1 in this Example, the cleaning device 22 having the lower priority can be kept waiting in a position, the distance between this position and the cleaning-starting position P7 being shorter than that between the retreat position P6 and the cleaning-starting position P7, so that the time needed for the cleaning device 22, after being kept waiting, to reach the cleaning-starting position P7 can be decreased. Consequently, the time needed to clean a wafer 2 can further be decreased.

Moreover, in the above-described substrate cleaning system 1, the cleaning device 22 having the lower priority is kept waiting not at a point at a height level at which it travels from the retreat position P6 to the waiting position P10 (elevated state) but at a point (position in the vertical direction: MIDL) at a lower height level, closer to the substrate, than the above height level. Therefore, according to the substrate cleaning system 1 in this Example, the time needed for the cleaning device 22 having the lower priority, sitting in the cleaning-starting position P7, to go down after starting cleaning can be decreased. Consequently, the time needed for cleaning a wafer 2 can further be decreased.

EXAMPLE 2

The precondition of Example 2 is that the driving recipes 55, 56 and 57 as shown in FIGS. 8A to 8C, made by an operator, have been previously recorded in the recording medium 60 by means of the input means 58.

Figure 13:
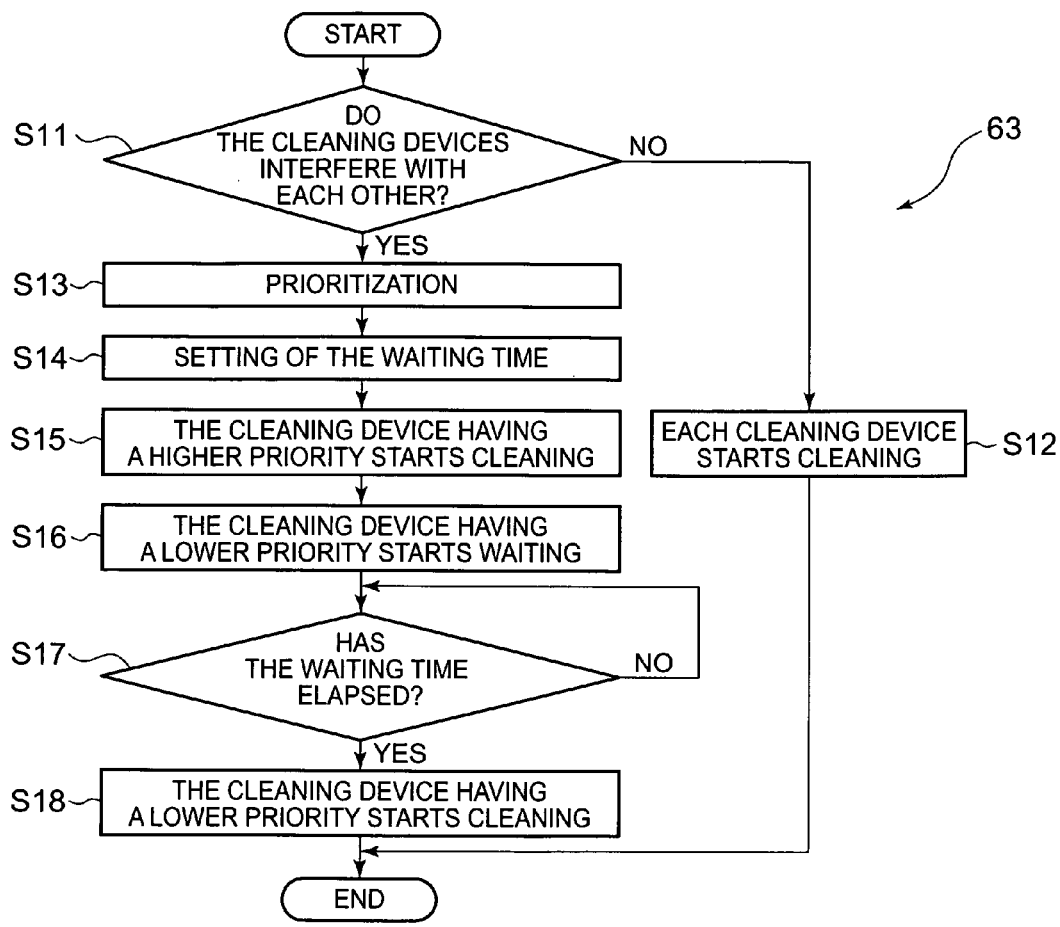
FIG. 13 is a flow chart showing a substrate cleaning program.

In this Example 2, the cleaning devices 20, 21 and 22 are prevented from interfering with each other by making the controller 54 control the driving of the cleaning devices 20, 21 and 22 in accordance with the substrate cleaning program 63 stored in the recording medium 60. The substrate cleaning program 63 has been made beforehand following the flow chart shown in FIG. 13.

In the substrate cleaning program 63, it is first judged, on the basis of the driving recipes for the cleaning devices 20, 21 and 22, whether the cleaning devices 20, 21 and 22 will interfere with each other (judging interference step S11), as in the substrate cleaning program 59.

Like the substrate cleaning program 59, the substrate cleaning program 63 makes the cleaning devices 20, 21 and 22 carry out cleaning operation in accordance with the driving recipes 55, 56 and 57, respectively, when it is judged in the judging interference step S11 that no interference will occur between the cleaning devices (starting cleaning step S12). On the other hand, if it is judged that the cleaning devices will cause interference, the following steps S13 to S18 are performed.

Next, like the substrate cleaning program 59, the substrate cleaning program 63 prioritizes the first, second and third cleaning devices 20, 21 and 22, so as to set the order in which they start cleaning (prioritizing step S13). Also in the following description, the control of driving of only the first cleaning device 20 and the third cleaning device 22 is explained because the second cleaning device 21 is held in the retreat position P5 as prescribed in the driving recipe 56 and does not carry out cleaning operation.

Like the substrate cleaning program 59, the substrate cleaning program 63 then calculates, on the basis of the driving recipe 55 for the first cleaning device 20 having the higher priority and the driving recipe 57 for the third cleaning device 22 having the lower priority, the time in which the first cleaning device 20 having the higher priority and the third cleaning device 22 having the lower priority can interfere with each other. The time calculated in this manner is set as waiting time (setting waiting time step S14).

Specifically, on the basis of the driving recipe 55 for the first cleaning device 20 and the driving recipe 57 for the third cleaning device 22, the time in which the first cleaning device 20 having the higher priority and the third cleaning device 22 having the lower priority can interfere with each other is calculated. In this Example, the direction in which the first cleaning device 20 cleans a wafer 2 is opposite to the direction in which the third cleaning device 23 cleans the wafer 2. Namely, the direction in which the first cleaning device 20 advances while cleaning a wafer is opposite to the direction in which the third cleaning device 22 advances while cleaning the wafer, in terms of the direction in which a pair of the guide rails 35 and 36 extend. Therefore, in the region in which the first-cleaning-device 20 traveling region, in which the first cleaning device 20 travels, horizontally overlaps the third-cleaning-device 22 traveling region, in which the third cleaning device 22 travel, the first cleaning device 20 and the third cleaning device 22 can interfere with each other. Specifically, when the first cleaning device 20 is present in the vicinity of the cleaning-starting position P2, or when the third cleaning device 22 is present in the vicinity of the cleaning-starting position P7, the two cleaning devices interfere with each other, but after this, no interference occurs between them.

For this reason, when the first cleaning device 20, whose movement starts from the cleaning-starting position P2, reaches the position (this position is referred to as passing position P11) apart from the third cleaning device 22 sitting in the cleaning-starting position P7, by the minimum accessible distance at which the first cleaning device 20 and the third cleaning device 22 do not interfere with each other, the possibility that the third cleaning device 22 might interfere with the first cleaning device 20 is eliminated. Therefore, the interference can be avoided by making the third cleaning device 22 reach the cleaning-starting position P7 after the first cleaning device 20, moving from the cleaning-starting position P2, has reached the passing position P11.

The time needed for the first cleaning device 20 to move from the cleaning-starting position P2 to the passing position P11 is denoted by T1. Namely, time T1 is the time needed for the first cleaning device 20, after departing from the cleaning-starting position P2, to reach the position 11 at which interference between the first cleaning device 20 and the third cleaning device 22 is avoidable. In other words, time T1 is the time needed for the first cleaning device 20, after departing from the cleaning-starting position P2, to come out of the interference region 61. Further, the time needed for the third cleaning device 22 to move from the waiting position P10 to the cleaning-starting position P7 is denoted by T2. Namely, time T2 is the time needed for the third cleaning device 22, after departing from the predetermined waiting position P10, to reach the position (cleaning-starting position) P7 at which the third cleaning device 22 interferes with the first cleaning device 20 with the highest probability. In other words, time T2 is the time needed for the third cleaning device 22, after departing from the predetermined waiting position P10, to reach a position closest to the side (one side) of the first cleaning device (higher priority cleaning device) 20 in the interference region.

The difference between time T1 and time T2 is the time in which interference between the cleaning devices 20 and 22 can occur, and the time for which the third cleaning device 22 should be kept waiting in the waiting position P10 so that the third cleaning device 22 is prevented from interfering with the first cleaning device 20. On the other had, when (T1−T2) is a negative value, the time needed for the first cleaning device 20 to reach the position P11 in which the first cleaning device 20 does not interfere with the third cleaning device 22 is shorter than the time needed for the third cleaning device 22, after departing from the waiting position P10, to reach the position P7 in which the third cleaning device 22 can interfere with the first cleaning device 20. Namely, even if the first cleaning device 20 departs from the cleaning-starting position P2 simultaneously with the departure of the third cleaning device 22 from the waiting position P10, the two cleaning devices 20 and 22 do not interfere with each other. Therefore, in the case where (T1−T2) is a negative value, the waiting time is made zero.

Further, as in Example 1, the waiting position P10 of the third cleaning device 22, which is set before setting the waiting time, is apart from the first cleaning device 20 sitting in the cleaning-starting position P2, by the minimum accessible distance at which the third cleaning device 22 does not interfere with the first cleaning device 20.

Next, like the substrate cleaning program 59, the substrate cleaning program 63 makes the first cleaning device 20 having the higher priority start cleaning a wafer 2 from the predetermined cleaning-starting position P2 towards the periphery of the wafer 2 (starting higher priority cleaning device step S15).

Further, like the substrate cleaning program 59, the substrate cleaning program 63, while controlling the driving of the first cleaning device 20, moves the third cleaning device 22 having the lower priority to the predetermined waiting position P10 and keeps the third cleaning device 22 waiting in the waiting position P10 until the waiting time has elapsed since the cleaning device 20 having the higher priority, sitting in the cleaning-starting position, started cleaning (keeping lower priority cleaning device waiting step S16). Namely, the waiting time is strictly the difference between the time at which the first cleaning device 20 starts cleaning a wafer 2 and the time at which the third cleaning device 22 departs from the waiting position P10.

Next, in the substrate cleaning program 63, it is judged whether the waiting time has elapsed since the first cleaning device 20 having the higher priority started cleaning (judging elapsed time step S17). For example, whether the waiting time has elapsed can be known by a timer built in the controller 54.

After the waiting time has elapsed since the first cleaning device 20 having the higher priority started cleaning, the substrate cleaning program 63 moves the third cleaning device 22 having the lower priority to the predetermined cleaning-starting position P7. Thereafter, the third cleaning device 22 starts cleaning the wafer 2 from the cleaning-starting position P7 towards the periphery of the wafer 2 (setting lower priority cleaning device step S18).

In the substrate cleaning program 63, by performing the above-described steps S11 to S18, the driving of the first cleaning device 20 and the driving of the third cleaning device 22 are simultaneously controlled so as to clean a wafer 2.

Therefore, as for the third cleaning device 22, its driving is controlled in accordance with the driving recipe 62 shown in FIG. 12, as in Example 1, and the third cleaning device 22 is kept waiting in the waiting position P10, as the fourth step, until the waiting time has elapsed since the first cleaning device 20 started cleaning.

Consequently, after the setting waiting time step S14, even if the substrate cleaning program 63 automatically makes the driving recipe 62 and controls the driving of the first cleaning device 20 faithfully following the driving recipe 55 that has been input and the driving of the third cleaning device 22 faithfully following the driving recipe 62 that has been automatically made. As a result of these, the above-described steps S13 to S18 are performed.

As described above, the substrate cleaning system 1 in this Example performs the method of cleaning a wafer 2 in accordance with the substrate cleaning program 63. Namely, a plurality of the cleaning devices 20, 21 and 22 are prioritized, and on the basis of the driving recipe 55 for the cleaning device 20 having the higher priority and the driving recipe 57 for the cleaning device 22 having the lower priority, the time in which the cleaning device 20 having the higher priority and the cleaning device 22 having the lower priority can interfere with each other is calculated and the calculated time is set as waiting time. More specifically, time T1 needed for the cleaning device having the higher priority to move from the cleaning-starting position P2 to the position P11 in which the cleaning device having the higher priority does not interfere with the cleaning device having the lower priority is calculated. Further, time T2 needed for the cleaning device 22 having the lower priority to move from the predetermined waiting position P10 to the position P7 in which the cleaning device 22 having the lower priority can interfere with the cleaning device 20 having the higher priority is calculated. The time obtained by subtracting time T2 from time T1 is taken as the waiting time. Namely, the waiting time, which should be set in order to avoid interference between the two cleaning devices 20 and 22, is herein equal to the difference between the time at which the first cleaning device 22 departs from the cleaning-starting position P2 and the time at which the third cleaning device 23 departs from the waiting position P10. Therefore, the cleaning device 20 having the higher priority is made to start cleaning a wafer 2 from the predetermined cleaning-starting position P2 towards the periphery of the wafer 2, while the cleaning device 22 having the lower priority is kept waiting in the waiting position P10 until the waiting time has elapsed since the cleaning device 20 having the higher priority started cleaning. Thereafter, when or after the waiting time has elapsed since the cleaning device 20 having the higher priority started cleaning the wafer 2, the cleaning device 22 having the lower priority departs from the waiting position P10 towards the cleaning-starting position P7. The cleaning device 22 having the lower priority then starts cleaning the wafer 2 from the cleaning-starting position P7 towards the periphery of the wafer 2.

Therefore, in the above-described substrate cleaning system 1, even when a plurality of the cleaning devices 20, 21 and 22 interfere with each other when driven in accordance with the driving recipes 55, 56 and 57 made by an operator, respectively, a wafer 2 can be cleaned by operating the cleaning devices 20, 21 and 22 at the same time, while automatically avoiding interference between them. The time need to clean a wafer 2 can thus be decreased, and the throughput of the substrate-cleaning process in the substrate cleaning system 1 can be improved. Moreover, the operator need not make driving recipes 55, 56 and 57 again. The time and labor required to make driving recipes 55, 56 and 57 can therefore be reduced.

EXAMPLE 3

The precondition of Example 3 is that the driving recipes 64, 65 and 66 as shown in FIGS. 14A to 14C, made by an operator, have been previously recorded in the recording medium 60 by means of the input means 58.

In this Example 3, the controller 54 controls the driving of the cleaning devices 20, 21 and 22 in accordance with the substrate cleaning program 63 stored in the recording medium 60, thereby preventing the cleaning devices 20, 21 and 22 from interfering with each other, as in Example 2. In Example 3, the first priority is given to the second cleaning device 21, the second priority is given to the first cleaning device 20, and the third priority is given to the third cleaning device 22.

In Example 3, the first cleaning device 20 and the second cleaning device 21 interfere with each other not only in the vicinity of the cleaning-starting position but also in the vicinity of the cleaning end position, unlike in Example 2, because of the driving recipes 64, 65 and 66 shown in FIG. 14. Therefore, Example 3 is different from Example 2 in the manner in which the waiting time is set in the setting waiting time step S14 in the substrate cleaning program 63.

Namely, in Example 3, the time in which the second cleaning device 21 having the higher priority and the first cleaning device 20 having the lower priority can interfere with each other is calculated on the basis of the driving recipe 64 for the first cleaning device 20 and the driving recipe 65 for the second cleaning device 65 in the setting waiting time step S14. In this Example, the direction in which the first cleaning device 20 cleans a wafer 2 is the same as the direction in which the second cleaning device 21 cleans the wafer 2. Namely, the direction in which the first cleaning device 20 advances while cleaning a wafer 2 is the same as the direction in which the second cleaning device 21 advances while cleaning the wafer 2, in terms of the direction in which a pair of the guide rails 35 and 36 extend. In addition, the speed at which the second cleaning device 21 travels in the horizontal direction (along the guide rails) is the same as the speed at which the first cleaning device 20 travels in the horizontal direction (along the guide rails). Therefore, when the second cleaning device 21 is in the cleaning-starting position P2 at which the traveling of the second cleaning device 21 in the horizontal direction (along the guide rails) is stopped, the second cleaning device 21 can interfere with the first cleaning device 20, and even when the second cleaning device 21 is in the cleaning end position P4 at which the traveling of the second cleaning device 21 in the horizontal direction (along the guide rails) is stopped again, the second cleaning device 21 can interfere with the first cleaning device 20. Namely, the first cleaning device 20 and the second cleaning device 21 can interfere with each other not only in the vicinity of the cleaning-starting position P2 (in the first interference region) but also in the vicinity of the cleaning end position P4 (in the second interference region).

For this reason, the possibility that the first cleaning device 20 might interfere with the second cleaning device 21 is eliminated by moving the second cleaning device 21, whose movement starts from the cleaning-starting position P2, to the position away from the first cleaning device 20 sitting in the cleaning-starting position P2, by the minimum accessible distance at which interference between the first and second cleaning devices does not occur (this position is referred to as passing position P11). It is thus possible to avoid the interference by making the first cleaning device 20 reach the cleaning-starting position P2 after the second cleaning device 21 has moved from the cleaning-starting position P2 to the passing position P11.

Further, the possibility that the first cleaning device 20 might interfere with the second cleaning device 21 at the end of cleaning is eliminated by moving the second cleaning device 21, whose movement starts from the cleaning end position P4, to the position away from the first cleaning device 20 sitting in the cleaning end position P4, by the minimum accessible distance at which interference does not occur between the first cleaning device 20 and the second cleaning device 21 (this position is referred to as passing position P13). It is thus possible to avoid the interference by making the first cleaning device 20 reach the cleaning end position P4 after the second cleaning device 21 has moved to the passing position P13 from the cleaning end position P4.

The time needed for the second cleaning device 21 to move from the cleaning-starting position P2 to the passing position P11 is denoted by T11. Namely, time T11 is the time needed for the second cleaning device 21, after departing from the cleaning-starting position P2, to reach the position 11 in which interference between the second cleaning device 21 and the first cleaning device 20 is avoidable. In other words, time T11 is the time needed for the second cleaning device 21 to come out of the first interference region after departing from the cleaning-starting position P2. Further, the time needed for the first cleaning device 20 to move from the waiting position P12 to the cleaning-starting position P2 is denoted by T12. Namely, time T12 is the time needed for the first cleaning device 20, after departing from the predetermined waiting position P12, to reach the position (the cleaning-starting position) P2 in which the first cleaning device 20 interferes with the second cleaning device 21 with the highest probability. In other words, time T12 is the time needed for the first cleaning device 20, after departing from the predetermined waiting position P12, to reach a position closest to the side (one side) of the second cleaning device (higher priority cleaning device) 21 in the first interference region.

The difference between time T11 and time T12 is the time in which first interference can occur, and the time for which the first cleaning device 20 should be kept waiting in the waiting position P12 (first waiting time) in order to prevent the first cleaning device 20 from interfering with the second cleaning device 21. On the other had, when (T11−T12) is a negative value, the time needed for the second cleaning device 21 to reach the position P11 in which the second cleaning device 21 does not interfere with the first cleaning device 20 is shorter than the time needed for the first cleaning device 20, after departing from the waiting position P12, to reach the position P2 in which the first cleaning device 20 can interfere with the second cleaning device 21. Namely, even if the second cleaning device 21 departs from the cleaning-starting position P2 simultaneously with the departure of the first cleaning device 20 from the waiting position P12, they will not interfere with each other. Therefore, in the case where (T11−T12) is a negative value, the first waiting time is made zero.

In this embodiment, the retreat position P5 of the second cleaning device 21 having the higher priority is on one side of a wafer 2, horizontally apart from the wafer 2 (on the right-hand side in the top plane view shown in FIG. 3). The retreat position P1 of the first cleaning device 20 having the lower priority is on the same side of the wafer 2, horizontally apart from the wafer 2 (on the right-hand side in the top plane view shown in FIG. 3). Further, in this embodiment, each cleaning device starts cleaning a wafer 2 from the approximate center of the wafer 2, and cleans the wafer 2 while moving from the center of the wafer 2 towards the side on which the retreat position of the cleaning device is set. Furthermore, in this embodiment, the waiting position P12 in which the first cleaning device 20 having the lower priority is kept waiting is set outside the interference region 61, and nearer to the other side (the side opposite to said one side) than the cleaning-starting position P7. Namely, the waiting position P12 is set so that the first cleaning device 20 can be horizontally apart from the second cleaning device 21 sitting in the cleaning-starting position P2 toward the other side (the side opposite to said one side), by the minimum accessible distance at which the first and second cleaning devices 20, 21 do not interfere with each other. In other words, the waiting position P12 is set so that the cleaning device 20 having the lower priority can be apart from the cleaning device 21 having the higher priority, sitting in the cleaning-starting position P2, by the minimum accessible distance at which the cleaning device 20 having the lower priority does not interfere with the cleaning device 21 having the higher priority, towards the side opposite to the direction in which the cleaning device 21 having the higher priority moves while cleaning a wafer.

On the other hand, the time needed for the second cleaning device 21 to move from the cleaning-starting position P2 to the passing position P13 is denoted by T13. Namely, time T13 is the time needed for the second cleaning device 21, after departing from the cleaning-starting position P2, to reach the position 13 in which the second cleaning device 21 can be prevented from interfering with the first cleaning device 20. In other words, time T13 is the time needed for the second cleaning device 21, after departing from the cleaning-starting position P2, to come out of the above-described second interference region. Further, the time needed for the first cleaning device 20 to move from the waiting position P12 to the cleaning end position P4 is denoted by T14. Namely, time T14 is the time needed for the first cleaning device 20, after departing from the predetermined waiting position P12, to reach the position (cleaning end position) P4 in which the first cleaning device 20 interferes with the second cleaning device 21 with the highest probability. In other words, time T14 is the time needed for the first cleaning device 20, after departing from the predetermined waiting position P12, to reach a position closest to the side (one side) of the second cleaning device (higher priority cleaning device) 21 in the second interference region.

The difference between time T13 and time T14 is the time in which second interference can occur, and the time for which the first cleaning device 20 should be kept waiting in the waiting position P12 so that the first cleaning device 20 does not interference with the second cleaning device 21 (second waiting time). On the other had, when (T13−T14) is a negative value, the time needed for the second cleaning device 21 to reach the position P13 in which the second cleaning device 21 does not interfere with the first cleaning device 20 is shorter than the time needed for the first cleaning device 20, after departing from the waiting position P12, to reach the position P4 in which the first cleaning device 20 can interfere with the second cleaning device 21. Namely, even if the second cleaning device 21 departs from the cleaning-starting position P2 simultaneously with the departure of the first cleaning device 20 from the waiting position P12, the two cleaning devices do not interfere with each other. Therefore, in the case where (T13−T14) is a negative value, the second waiting time is made zero.

The first waiting time and the second waiting time are compared with each other, and the longer one is set as the waiting time. By so setting the waiting time, interference between the cleaning devices can be avoided at both the beginning and end of cleaning.

Thus, in the setting waiting time step S14 in the substrate cleaning program 63, if it is judged, on the basis of the driving recipe for the cleaning device having the higher priority and the driving recipe for the cleaning device having the lower priority, that the cleaning device having the higher priority and the cleaning device having the lower priority can interfere with each other two or more times, the time in which the two cleaning devices can interfere with other in each time is calculated, and the longest time among the calculated time is set as the waiting time. By so setting the waiting time, even if the cleaning device having the higher priority and the cleaning device having the lower priority will interfere with each other two or more times, the interference is avoidable.

Figure 16:
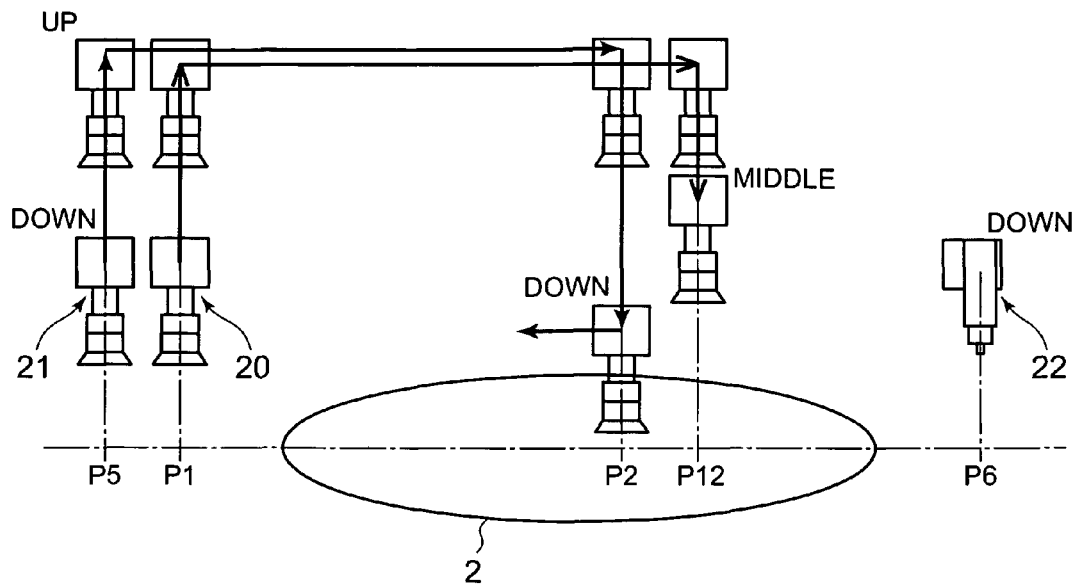
FIG. 16 is a diagram for explaining the operation of cleaning devices.
Figure 17:
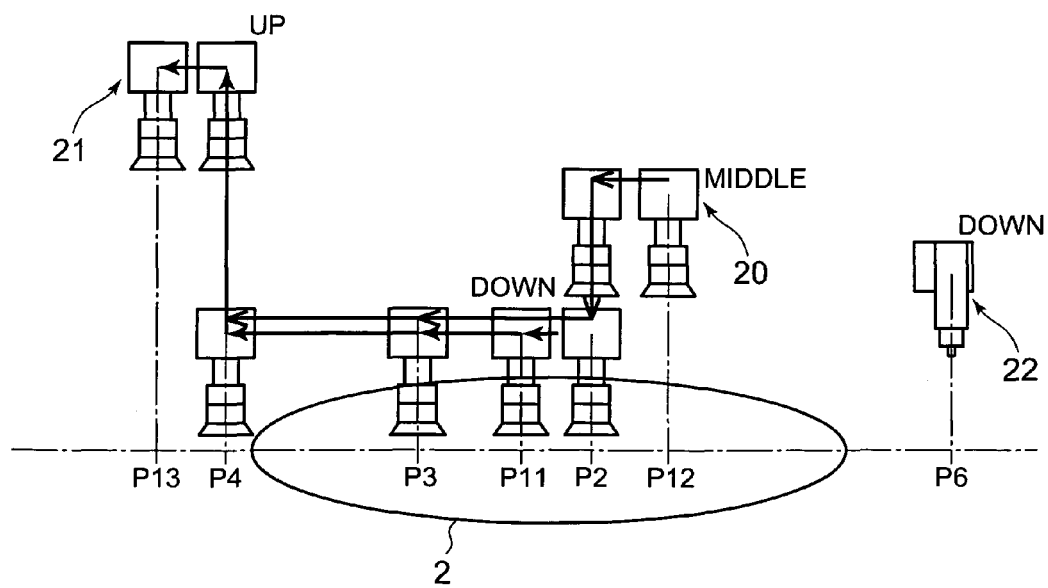
FIG. 17 is a diagram for explaining the operation of cleaning devices.
Figure 18:
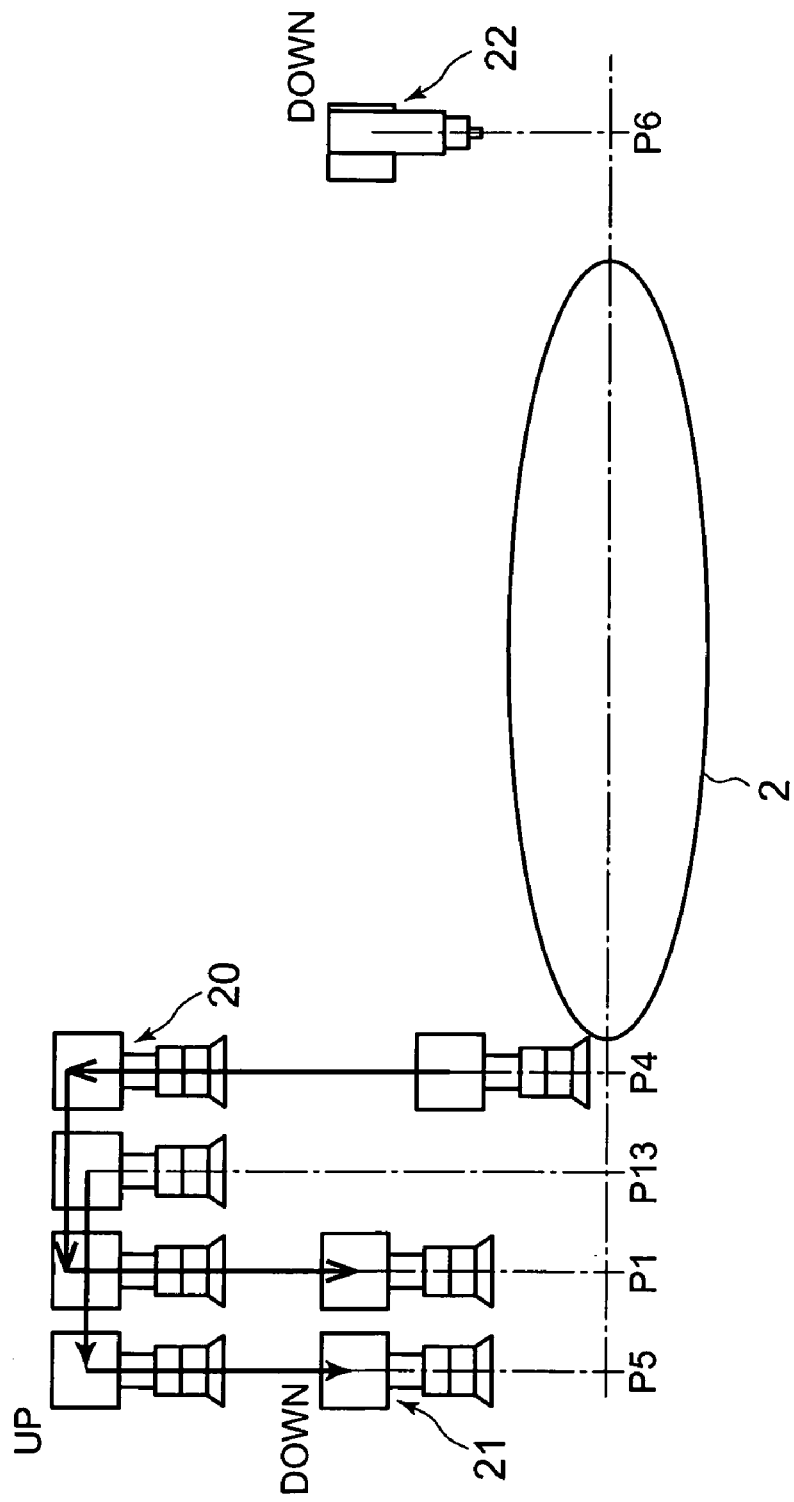
FIG. 18 is a diagram for explaining the operation of cleaning devices.

According to this Example 3, the driving of the second cleaning device 21 and that of the third cleaning device 22 are controlled in accordance with the driving recipe 65 and the driving recipe 66, respectively, and the driving of the first cleaning device 20 in accordance with the driving recipe 67 shown in FIG. 15 (see FIGS. 16 to 18). Namely, as shown in FIG. 15, the first cleaning device 20 in the retreat position P1 is elevated, as the first step. Next, the first cleaning device 20 elevated is, as the second step, made to move as it is from the retreat position P1 to the waiting position P12 via the cleaning-starting position P2 at a speed of 150 mm/s. Thereafter, the first cleaning device 20 in the waiting position P12 is downed, as the third step. The first cleaning device 20 downed is then kept waiting in the waiting position P12 for the above-described waiting time, as the fourth step. The first cleaning device 20 downed is made to move as it is from the waiting position P12 to the cleaning-starting position P2 at a speed of 150 mm/s, as the fifth step. Thereafter, the first cleaning device 20 is downed further towards a wafer 2, as the sixth step. The first cleaning device 20 downed is made to move as it is from the cleaning-starting position P2 to the speed-change position P3 at a speed of 15 mm/s, as the seventh step. Next, the first cleaning device 20 downed is made to move as it is from the speed-change position P3 to the cleaning end position P4 at a speed of 10 mm/s, as the eighth step. The first cleaning device 20 in the cleaning end position P4 is then elevated, as the ninth step. The first cleaning device 20 elevated is made to move as it is from the cleaning end position P4 to the retreat position P1 at a speed of 150 mm/s, as the tenth step. The first cleaning device 20 in the retreat position P1 is then downed, as the eleventh step.

The driving of the first cleaning device 20 having the second priority and the driving of the third cleaning device 22 having the lowest priority are of course controlled so that they will not interfere with each other. The interference between the first cleaning device 20 and the third cleaning device 22 can be avoided in the same manner as in Example 1 or 2.

The invention claimed is:

1. A substrate cleaning system comprising cleaning devices for cleaning a substrate, and a means for controlling the driving of the cleaning devices in accordance with driving recipes predetermined,
wherein the means for controlling the driving of the cleaning devices:
prioritizes the cleaning devices;
calculates, on the basis of a driving recipe for a cleaning device having a higher priority and a driving recipe for a cleaning device having a lower priority, a time in which the cleaning device having the higher priority and the cleaning device having the lower priority can interfere with each other and sets the calculated time as a waiting time;
makes the cleaning device having the higher priority, which has been moved from a retreat position set outside the substrate, start cleaning the substrate from a predetermined cleaning-starting position towards a periphery of the substrate;
keeps the cleaning device having the lower priority, which has been moved from a retreat position set outside the substrate, waiting in a predetermined waiting position located immediately above the substrate and apart from the retreat position of the cleaning device having the lower priority; and
moves the cleaning device having the lower priority from the waiting position when or after the waiting time has elapsed since the cleaning device having the higher priority started cleaning, and makes the cleaning device having the lower priority start cleaning the substrate from a predetermined cleaning-starting position, which is horizontally apart from the waiting position, towards the periphery of the substrate.

2. The substrate cleaning system according to claim 1, wherein the means for controlling the driving of the cleaning devices sets travel coordinate axes, each of which is characteristic of a cleaning device; unifies the travel coordinate axes into a unified travel coordinate axis; and sets the waiting time by using the unified travel coordinate axis.

3. The substrate cleaning system according to claim 1, wherein the means for controlling the driving of the cleaning devices judges, on the basis of the driving recipe for the cleaning device having the higher priority and the driving recipe for the cleaning device having the lower priority, whether the cleaning device having the higher priority and the cleaning device having the lower priority can interfere with each other, and sets the waiting time when it is judged that the interference can occur.

4. The substrate cleaning system according to claim 3, wherein if the means for controlling the driving of the cleaning devices has judged, on the basis of the driving recipe for the cleaning device having the higher priority and the driving recipe for the cleaning device having the lower priority, that the cleaning device having the higher priority and the cleaning device having the lower priority can interfere with each other two or more times, the means for controlling the driving of the cleaning devices calculates the time in which the two cleaning devices can interfere with each other in each time and sets a longest time among the calculated times as the waiting time.

5. The substrate cleaning system according to claim 4, wherein when a direction in which the cleaning device having the higher priority performs cleaning is the same as a direction in which the cleaning device having the lower priority performs cleaning, the means for controlling the driving of the cleaning devices calculates a time in which one of the cleaning devices, sitting in the cleaning-starting position, can interfere with the other, and a time in which one of the cleaning devices, sitting in a cleaning end position, can interfere with the other, and sets a longer time among the calculated times as the waiting time.

6. The substrate cleaning system according to claim 1, wherein the waiting position of the cleaning device having the lower priority is between the retreat position of the cleaning device having the lower priority, set outside the substrate, in which the cleaning device having the lower priority is held when the cleaning device having the lower priority is not cleaning the substrate, and the cleaning-starting position of the cleaning device having the lower priority.

7. The substrate cleaning system according to claim 1, wherein the waiting position of the cleaning device having the lower priority is horizontally apart from the cleaning device having the higher priority, sitting in the cleaning-starting position, by a minimum accessible distance that is the distance of the cleaning device having the lower priority from the cleaning device having the higher priority when the cleaning device having the lower priority gets closest to the cleaning device having the higher priority without coming into contact with the cleaning device having the higher priority.

8. The substrate cleaning system according to claim 1, wherein the cleaning device having the lower priority has a cleaning member that will face the substrate,
the cleaning member moves in such a fashion that, after vertically coming away from the substrate, the cleaning member vertically re-approaches the substrate as the cleaning device having the lower priority moves, to the cleaning-starting position, from the retreat position of the cleaning device having the lower priority, set outside the substrate, in which the cleaning device having the lower priority is held when the cleaning device having the lower priority is not cleaning the substrate, and
the waiting position of the cleaning device having the lower priority is in the route of the cleaning member vertically re-approaching the substrate.

9. The substrate cleaning system according to claim 1, wherein a region in which the cleaning device having the higher priority and the cleaning device having the lower priority can interfere with each other is set as an interference region, and
the time in which the interference can occur is obtained by calculating the difference between the time needed for the cleaning device having the higher priority to come out of the interference region after leaving the cleaning-starting position, and the time needed for the cleaning device having the lower priority to reach a position in the interference region, closest to the cleaning device having the higher priority, after leaving the waiting position.

10. A substrate cleaning system comprising cleaning devices for cleaning a substrate and a means for controlling the driving of the cleaning devices in accordance with driving recipes predetermined,
wherein the means for controlling the driving of the cleaning devices:
prioritizes the cleaning devices;
sets, on the basis of a driving recipe for a cleaning device having a higher priority and a driving recipe for a cleaning device having a lower priority, an interference region in which the cleaning device having the higher priority and the cleaning device having the lower priority can interfere with each other;
makes the cleaning device having the higher priority, which has been moved from a retreat position set outside the substrate, start cleaning the substrate from a predetermined cleaning-starting position towards a periphery of the substrate;

keeps the cleaning device having the lower priority, which has been moved from a retreat position set outside the substrate, waiting in a predetermined waiting position located immediately above the substrate and apart from the retreat position of the cleaning device having the lower priority; and moves the cleaning device having the lower priority from the waiting position when or after the cleaning device having the higher priority has come out of the interference region, and makes the cleaning device having the lower priority start cleaning the substrate from a predetermined cleaning-starting position, which is horizontally apart from the waiting position, towards the periphery of the substrate.

11. The substrate cleaning system according to claim 10, wherein the interference region ranges between the position of the end, nearest to the cleaning device having the lower priority, of the cleaning device having the higher priority, sitting in the cleaning-starting position, and the position of the end, nearest to the cleaning device having the higher priority, of the cleaning device having the lower priority, sitting in the cleaning-starting position.

12. A substrate cleaning method of cleaning substrates by controlling the driving of cleaning devices in accordance with driving recipes predetermined, comprising steps for:

prioritizing the cleaning devices;

calculating, on the basis of a driving recipe for a cleaning device having a higher priority and a driving recipe for a cleaning device having a lower priority, a time in which the cleaning device having the higher priority and the cleaning device having the lower priority can interfere with each other, and setting the calculated time as a waiting time;

making the cleaning device having the higher priority, which has been moved from a retreat position set outside the substrate, start cleaning a substrate from a predetermined cleaning-starting position towards a periphery of the substrate;

keeping the cleaning device having the lower priority, which has been moved from a retreat position set outside the substrate, waiting in a predetermined waiting position located immediately above the substrate and apart from the retreat position of the cleaning device having the lower priority; and moving the cleaning device having the lower priority from the waiting position when or after the waiting time has elapsed since the cleaning device having the higher priority started cleaning, and making the cleaning device having the lower priority start cleaning the substrate from a predetermined cleaning-starting position, which is horizontally apart from the waiting position, towards the periphery of the substrate.

13. The substrate cleaning method according to claim 12, wherein travel coordinate axes, each of which is characteristic of a cleaning device, are set; the travel coordinate axes are unified into a unified travel coordinate axis; and the waiting time is set by using the unified travel coordinate axis.

14. The substrate cleaning method according to claim 12, wherein it is judged, on the basis of the driving recipe for the cleaning device having the higher priority and the driving recipe for the cleaning device having the lower priority, whether the cleaning device having the higher priority and the cleaning device having the lower priority can interfere with each other, and the waiting time is set if it is judged that the interference can occur.

15. The substrate cleaning method according to claim 14, wherein if it is judged, on the basis of the driving recipe for the cleaning device having the higher priority and the driving recipe for the cleaning device having the lower priority, that the cleaning device having the higher priority and the cleaning device having the lower priority can interfere with each other two or more times, the time in which the two cleaning devices can interfere with each other each time is calculated, and a longest time among the calculated times is set as the waiting time.

16. The substrate cleaning method according to claim 12, wherein the waiting position of the cleaning device having the lower priority is between the retreat position of the cleaning device having the lower priority, set outside the substrate, in which the cleaning device having the lower priority is held when the cleaning device having the lower priority is not cleaning the substrate, and the cleaning-starting position of the cleaning device having the lower priority.

17. The substrate cleaning method according to claim 12, wherein the waiting position of the cleaning device having the lower priority is horizontally apart from the cleaning device having the higher priority, sitting in the cleaning-starting position, by a minimum accessible distance that is the distance of the cleaning device having the lower priority from the cleaning device having the higher priority when the cleaning device having the lower priority gets closest to the cleaning device having the higher priority without coming into contact with the cleaning device having the higher priority.

18. The substrate cleaning method according to claim 12, wherein the cleaning device having the lower priority has a cleaning member that will face the substrate, the cleaning member moves in such a fashion that, after vertically coming away from the substrate, the cleaning member vertically re-approaches the substrate as the cleaning device having the lower priority moves, to the cleaning-starting position, from the retreat position of the cleaning device having the lower priority, set outside the substrate, in which the cleaning device having the lower priority is held when the cleaning device having the lower priority is not cleaning the substrate, and the waiting position of the cleaning device having the lower priority is in the route of the cleaning member vertically re-approaching the substrate.

19. The substrate cleaning method according to claim 12, wherein a region in which the cleaning device having the higher priority and the cleaning device having the lower priority can interfere with each other is set as an interference region, and the time in which the interference can occur is obtained by calculating the difference between the time needed for the cleaning device having the higher priority to come out of the interference region after leaving the cleaning-starting position, and the time needed for the cleaning device having the lower priority to reach a position in the interference region, closest to the cleaning device having the higher priority, after leaving the waiting position.

20. A substrate cleaning method of cleaning substrates by controlling the driving of cleaning devices in accordance with driving recipes predetermined, comprising steps for:

prioritizing the cleaning devices;

setting, on the basis of a driving recipe for a cleaning device having a higher priority and a driving recipe for a cleaning device having a lower priority, an interference region in which the cleaning device having the higher priority and the cleaning device having the lower priority can interfere with each other;

making the cleaning device having the higher priority, which has been moved from a retreat position set outside the substrate, start cleaning a substrate from a predetermined cleaning-starting position towards a periphery of the substrate;

keeping the cleaning device having the lower priority, which has been moved from a retreat position set outside the substrate, waiting in a waiting position located immediately above the substrate, apart from the retreat position of the cleaning device having the lower priority and outside the interference region; and moving the cleaning device having the lower priority from the waiting position when or after the cleaning device having the higher priority has come out of the interference region, and making the cleaning device having the lower priority start cleaning the substrate from a predetermined cleaning-starting position, which is horizontally apart from the waiting position, towards the periphery of the substrate.

21. A substrate cleaning program with which a substrate cleaning system comprising cleaning devices for cleaning a substrate, in which the driving of the cleaning devices is controlled in accordance with driving recipes predetermined, carries out cleaning operation, the substrate cleaning program comprising:

a prioritizing step for prioritizing the cleaning devices;

a setting waiting time step for calculating, on the basis of a driving recipe for a cleaning device having a higher priority and a driving recipe for a cleaning device having a lower priority, a time in which the cleaning device having the higher priority and the cleaning device having the lower priority can interfere with each other, and setting the calculated time as a waiting time;

a starting higher priority cleaning device step for making the cleaning device having the higher priority, which has been moved from a retreat position set outside the substrate, start cleaning a substrate from a predetermined cleaning-starting position towards a periphery of the substrate;

a keeping lower priority cleaning device waiting step for keeping the cleaning device having the lower priority, which has been moved from a retreat position set outside the substrate, waiting in a predetermined waiting position located immediately above the substrate and apart from the retreat position of the cleaning device having the lower priority; and a starting lower priority cleaning device step for moving the cleaning device having the lower priority from the waiting position when or after the waiting time has elapsed since the cleaning device having the higher priority started cleaning, and making the cleaning device having the lower priority start cleaning the substrate from a predetermined cleaning-starting position, which is horizontally apart from the waiting position, towards the periphery of the substrate.

22. The substrate cleaning program according to claim 21, wherein travel coordinate axes, each of which is characteristic of each cleaning device, are set; the travel coordinate axes are unified into a unified travel coordinate axis; and the waiting time is set in the setting waiting time step by using the unified travel coordinate axis.

23. The substrate cleaning program according to claim 22, wherein if it is judged, on the basis of the driving recipe for the cleaning device having the higher priority and the driving recipe for the cleaning device having the lower priority, that the cleaning device having the higher priority and the cleaning device having the lower priority can interfere with each other two or more times, the time in which the two cleaning devices can interfere with each other each time is calculated, and a longest time among the calculated times is set as the waiting time.

24. A substrate cleaning program with which a substrate cleaning system comprising cleaning devices for cleaning a substrate, in which the driving of the cleaning devices is controlled in accordance with driving recipes predetermined, carries out cleaning operation, the substrate cleaning program comprising:

a prioritizing step for prioritizing the cleaning devices;

a setting interference region step for setting, on the basis of a driving recipe for a cleaning device having a higher priority and a driving recipe for a cleaning device having a lower priority, an interference region in which the cleaning device having the higher priority and the cleaning device having the lower priority can interfere with each other;

a starting higher priority cleaning device step for making the cleaning device having the higher priority, which has been moved from a retreat position set outside the substrate, start cleaning the substrate from a predetermined cleaning-starting position towards a periphery of the substrate;

a keeping lower priority cleaning device waiting step for keeping the cleaning device having the lower priority, which has been moved from a retreat position set outside the substrate, waiting in a waiting position located immediately above the substrate, apart from the retreat position of the cleaning device having the lower priority and outside the interference region; and a starting lower priority cleaning device step for moving the cleaning device having the lower priority from the waiting position when or after the cleaning device having the higher priority has come out of the interference region and making the cleaning device having the lower priority start cleaning the substrate from a predetermined cleaning-starting position, which is horizontally apart from the waiting position, towards the periphery of the substrate.

25. A non-transitory, program recording medium in which a substrate cleaning program is recorded, and with which a substrate cleaning system comprising cleaning devices for cleaning a substrate, in which the driving of the cleaning devices is controlled in accordance with driving recipes predetermined, carries out a cleaning operation, the substrate cleaning program comprising:

a prioritizing step for prioritizing the cleaning devices;

a setting waiting time step for calculating, on the basis of a driving recipe for a cleaning device having a higher priority and a driving recipe for a cleaning device having a lower priority, a time in which the cleaning device having the higher priority and the cleaning device having the lower priority can interfere with each other, and setting the calculated time as a waiting time;

a starting higher priority cleaning device step for making the cleaning device having the higher priority, which has been moved from a retreat position set outside the substrate, start cleaning a substrate from a predetermined cleaning-starting position towards a periphery of the substrate;

a keeping lower priority cleaning device waiting step for keeping the cleaning device having the lower priority, which has been moved from a retreat position set outside the substrate, waiting in a predetermined waiting position located immediately above the substrate and apart from the retreat position of the cleaning device having the lower priority; and a starting lower priority cleaning device step for moving the cleaning device having the lower priority from the waiting position when or after the waiting time has elapsed since the cleaning device having the higher priority started cleaning, and making the cleaning device having the lower priority start cleaning the substrate from a predetermined cleaning-starting position, which is horizontally apart from the waiting position, towards the periphery of the substrate.

26. A non-transitory, program recording medium in which a substrate cleaning program is recorded, and with which a substrate cleaning system comprising cleaning devices for cleaning a substrate, in which the driving of the cleaning devices is controlled in accordance with driving recipes predetermined, carries out a cleaning operation, the substrate cleaning program comprising:

a prioritizing step for prioritizing the cleaning devices;

a setting interference region step for setting, on the basis of a driving recipe for a cleaning device having a higher priority and a driving recipe for a cleaning device having a lower priority, an interference region in which the cleaning device having the higher priority and the cleaning device having the lower priority can interfere with each other;

a starting higher priority cleaning device step for making the cleaning device having the higher priority, which has been moved from a retreat position set outside the substrate, start cleaning the substrate from a predetermined cleaning-starting position towards a periphery of the substrate;

a keeping lower priority cleaning device waiting step for keeping the cleaning device having the lower priority, which has been moved from a retreat position set outside the substrate, waiting in a waiting position located immediately above the substrate, apart from the retreat position of the cleaning device having the lower priority and outside the interference region; and a starting lower priority cleaning device step for moving the cleaning device having the lower priority from the waiting position when or after the cleaning device having the higher priority has come out of the interference region and making the cleaning device having the lower priority start cleaning the substrate from a predetermined cleaning-starting position, which is horizontally apart from the waiting position, towards the periphery of the substrate.

* * * * *